United States Patent
Wang et al.

(10) Patent No.: US 12,051,749 B2
(45) Date of Patent: Jul. 30, 2024

(54) INTERFACIAL DUAL PASSIVATION LAYER FOR A FERROELECTRIC DEVICE AND METHODS OF FORMING THE SAME

(71) Applicant: Taiwan Semiconductor Manufacturing Company Limited, Hsinchu (TW)

(72) Inventors: Jiamin Wang, Hsinchu (TW); Blanka Magyari-Kope, Hsinchu (TW); Ashwathi Iyer, Hsinchu (TW); Chris Liu, Hsinchu (TW)

(73) Assignee: Taiwan Semiconductor Manufacturing Company Limited, Hsinchu (TW)

( * ) Notice: Subject to any disclaimer, the term of this patent is extended or adjusted under 35 U.S.C. 154(b) by 0 days.

(21) Appl. No.: 17/228,550

(22) Filed: Apr. 12, 2021

(65) Prior Publication Data
US 2021/0399137 A1 Dec. 23, 2021

Related U.S. Application Data

(60) Provisional application No. 63/042,598, filed on Jun. 23, 2020.

(51) Int. Cl.
*H01L 29/78* (2006.01)
*H01L 21/02* (2006.01)
(Continued)

(52) U.S. Cl.
CPC .. *H01L 29/78391* (2014.09); *H01L 21/02565* (2013.01); *H01L 29/40111* (2019.08);
(Continued)

(58) Field of Classification Search
CPC ............ H01L 29/78391; H01L 29/516; H01L 29/6684; H01L 29/4908; H01L 29/66969; H01L 29/7869
See application file for complete search history.

(56) References Cited

U.S. PATENT DOCUMENTS 5,477,061 A * 12/1995 Morohashi ......... H10N 60/0912
505/817
5,929,473 A * 7/1999 Nishihori ............. H10B 12/033
257/280
(Continued)

FOREIGN PATENT DOCUMENTS

JP 2008270313 A 11/2008
KR 20100123106 A 11/2010
(Continued)

OTHER PUBLICATIONS

Korean Patent and Trademark Office, KR Application No. 10-2021-0074120, Office Action, mailed Sep. 6, 2022, 6 pages.
(Continued)

*Primary Examiner* — Vincent Wall
(74) *Attorney, Agent, or Firm* — The Marbury Law Group, PLLC

(57) ABSTRACT

A semiconductor structure includes, from bottom to top or from top to bottom, a gate electrode, a ferroelectric dielectric layer, a metal-rich metal oxide layer, a dielectric metal nitride layer, and a metal oxide semiconductor layer. A ferroelectric field effect transistor may be provided by forming a source region and a drain region on the metal oxide semiconductor layer. The metal-rich metal oxide layer and the dielectric metal nitride layer homogenize and stabilize the interface between the ferroelectric dielectric layer and the metal oxide semiconductor layer, and reduce excess oxygen atoms at the interface, thereby improving switching characteristics of the ferroelectric field effect transistor.

20 Claims, 18 Drawing Sheets

(51) Int. Cl.
*H01L 21/28* (2006.01)
*H01L 29/49* (2006.01)
*H01L 29/51* (2006.01)
*H01L 29/66* (2006.01)
*H01L 29/786* (2006.01)
*H10B 51/30* (2023.01)

(52) U.S. Cl.
CPC ........ *H01L 29/4908* (2013.01); *H01L 29/516* (2013.01); *H01L 29/66969* (2013.01); *H01L 29/78618* (2013.01); *H01L 29/7869* (2013.01); *H10B 51/30* (2023.02)

(56) References Cited

U.S. PATENT DOCUMENTS

| | | | | |
|---|---|---|---|---|
| 6,750,126 | B1* | 6/2004 | Visokay | H01L 21/28202 257/E21.267 |
| 6,946,342 | B2* | 9/2005 | Yeo | H01L 21/31604 438/239 |
| 2012/0025287 | A1* | 2/2012 | Golubovic | H01L 29/42348 257/E27.084 |
| 2017/0084711 | A1* | 3/2017 | Lim | H01L 29/7854 |
| 2017/0141235 | A1* | 5/2017 | Lai | H01L 29/6684 |
| 2017/0373194 | A1* | 12/2017 | Yamazaki | H01L 29/78696 |
| 2019/0198638 | A1 | 6/2019 | Van Houdt et al. | |
| 2019/0305101 | A1 | 10/2019 | Sharma et al. | |
| 2019/0386142 | A1 | 12/2019 | Gros-Jean et al. | |
| 2020/0020704 | A1 | 1/2020 | Dong et al. | |
| 2020/0098926 | A1* | 3/2020 | Sharma | H01L 29/78391 |
| 2020/0176457 | A1* | 6/2020 | Sharma | H01L 29/4908 |
| 2020/0388685 | A1* | 12/2020 | Sharma | H01L 29/66795 |

FOREIGN PATENT DOCUMENTS

| | | |
|---|---|---|
| KR | 20160034917 A | 3/2016 |
| TW | 201344911 A | 11/2013 |
| TW | 201803121 A | 1/2018 |

OTHER PUBLICATIONS

Taiwan Patent and Trademark Office, Application No. 110121393 Office Action, mailed Feb. 10, 2022, 5 pages.
German Patent and Trademark Office, Application No. 102021109608.1 Office Action, mailed Apr. 8, 2023, 9 pages.
Kiyoshi Kato et al., 2012 Jpn. J. Appl. Phys. 51 021201; The Japan Society of Applied Physics 51 (2012) 021201; "Evaluation of Off-State Current Characteristics of Transistor Using Oxide Semiconductor Material, Indium-Gallium-Zinc Oxide", published online Jan. 13, 2012. 8 pages.
Patent and Trademark Office, Application No. 110121393 Office Action, mailed Jun. 9, 2023, 12 pages.
Taiwan Patent and Trademark Office, Application No. 110121393 Office Action, mailed Jun. 9, 2023, 24 pages.
German Patent and Trademark Office, Application No. 102021109608.1 Office Action, mailed Apr. 8, 2023, 20 pages.
Taiwan Patent and Trademark Office, Application No. 110121393 Office Action, mailed Feb. 10, 2022, 10 pages.

* cited by examiner

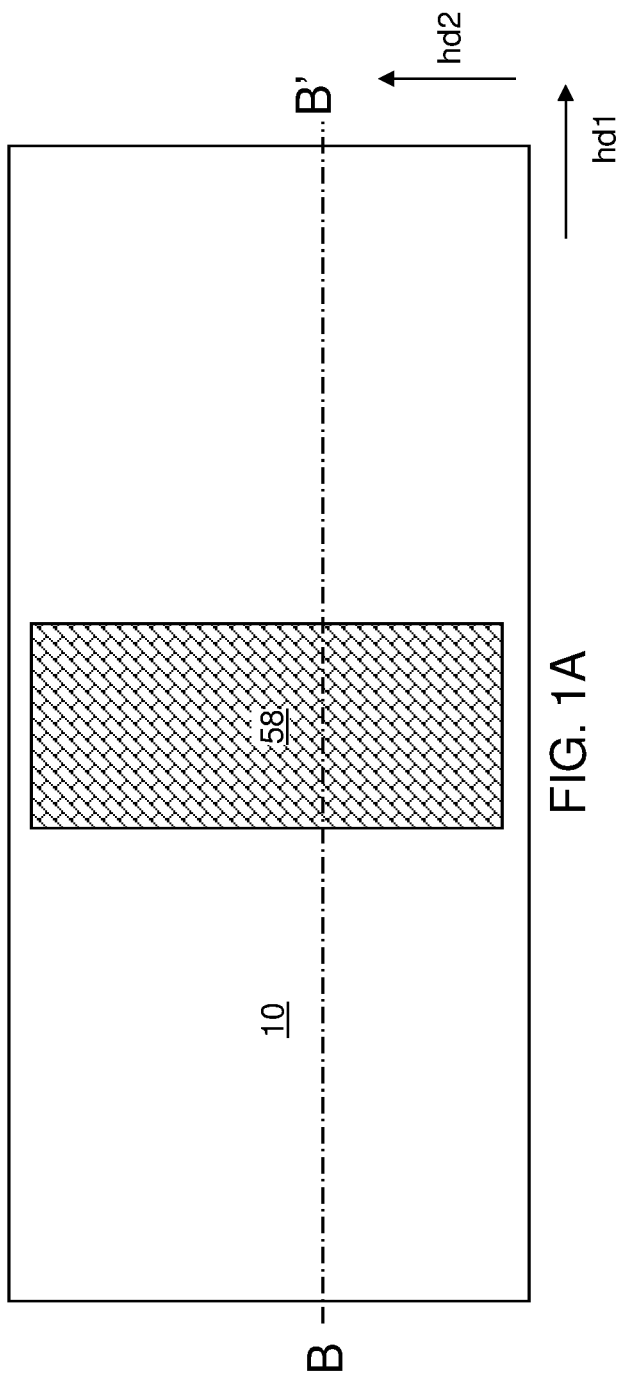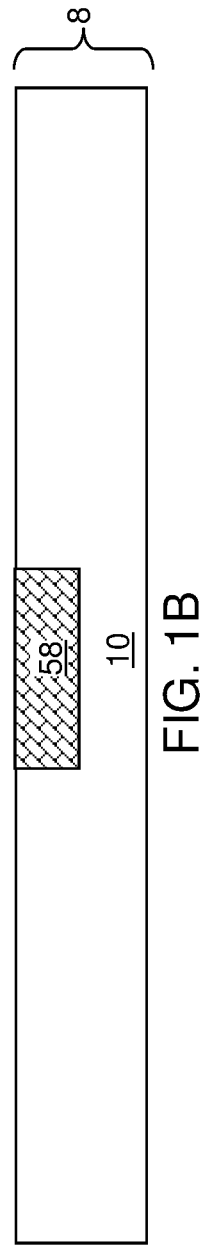

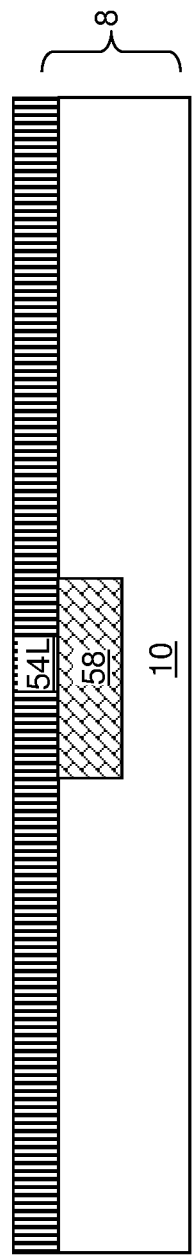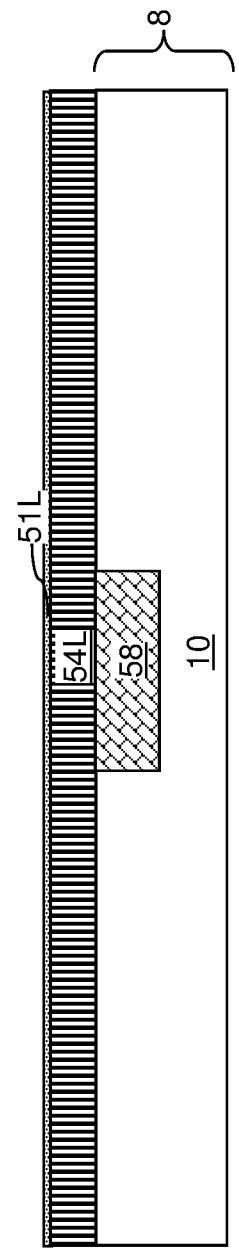

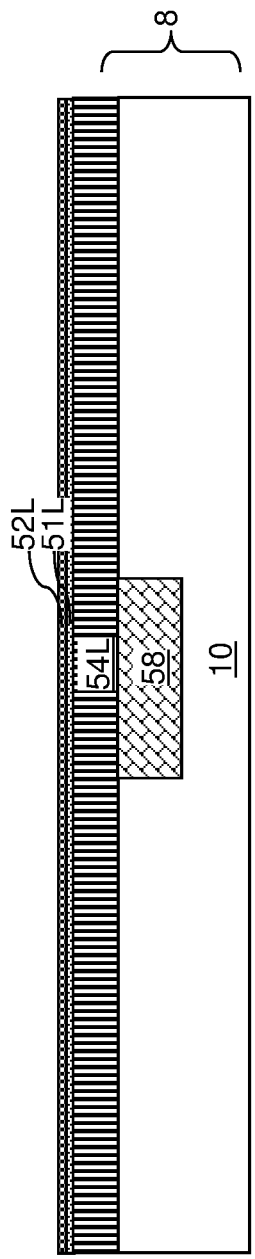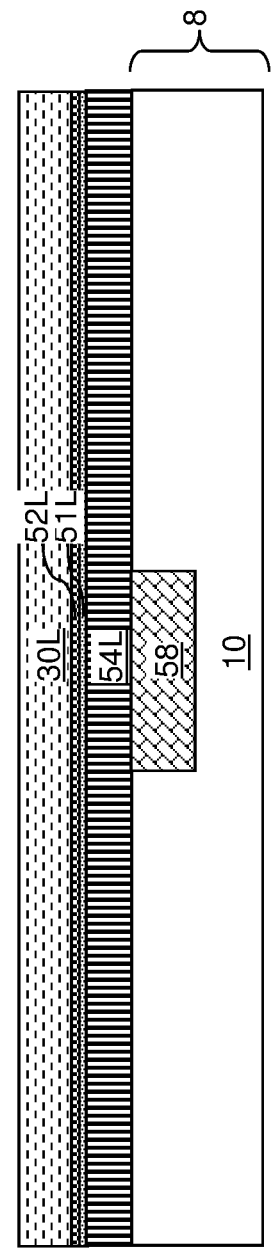

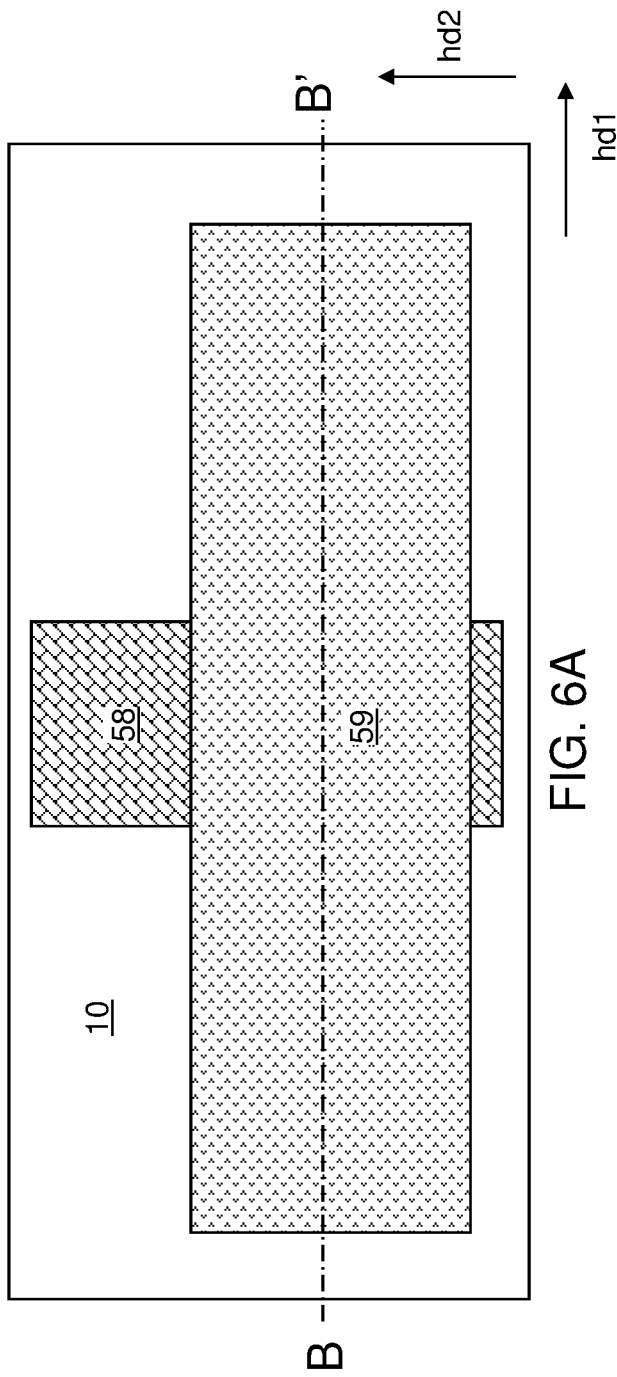
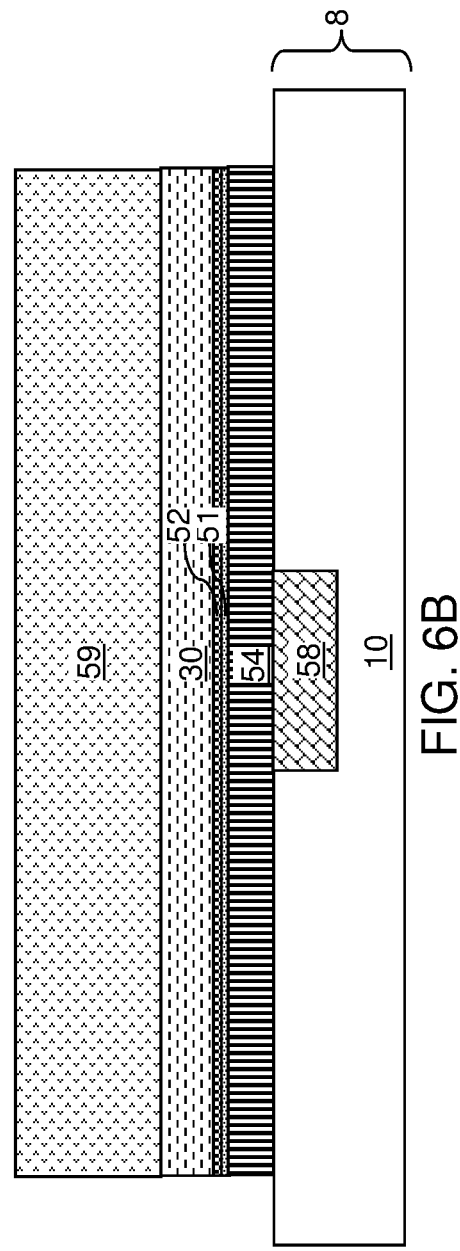
FIG. 6A
FIG. 6B

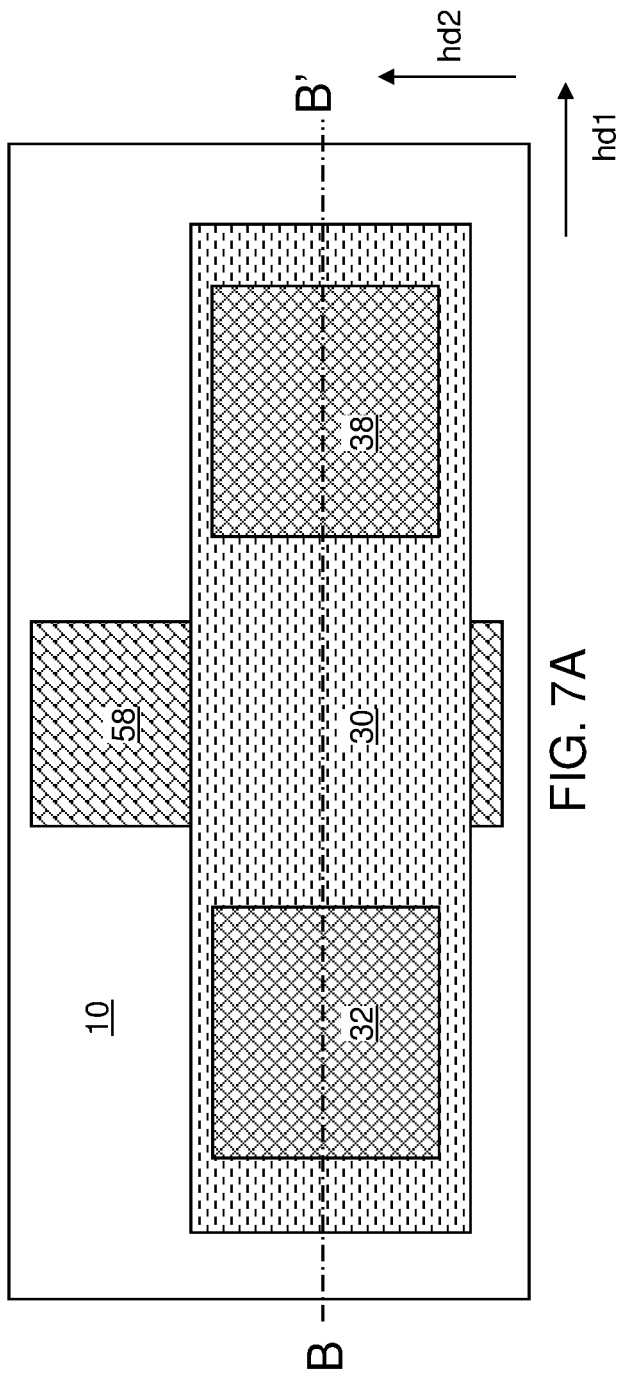
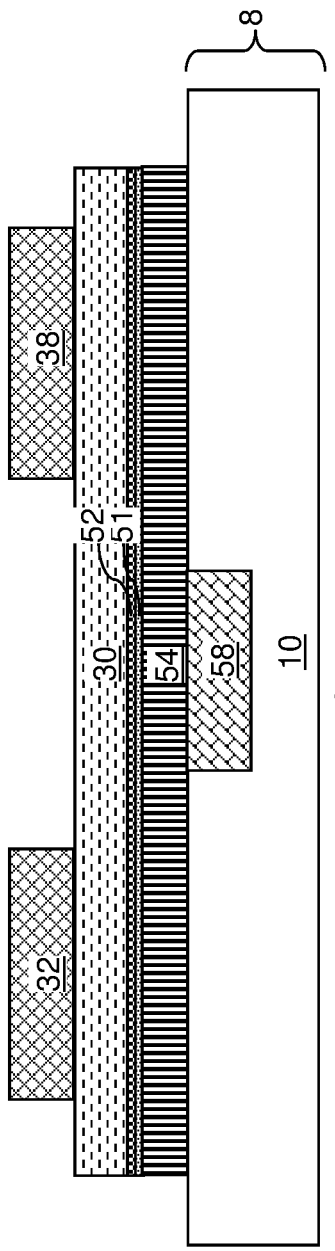
FIG. 7A
FIG. 7B

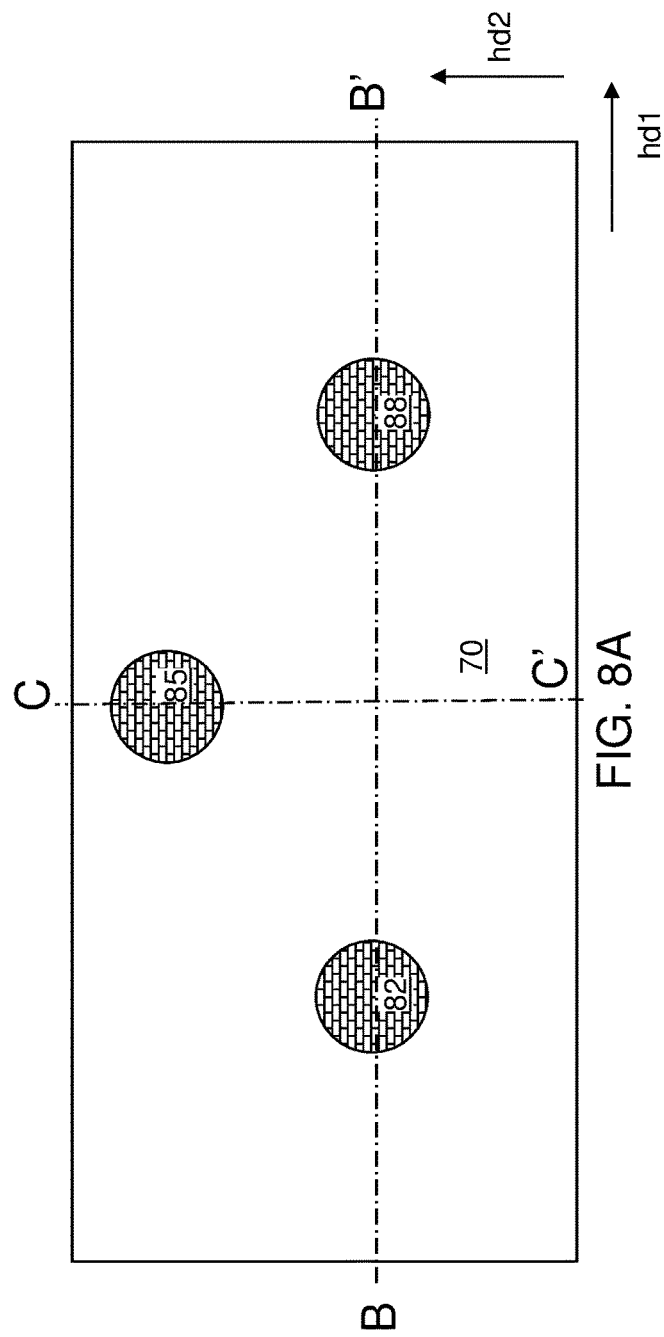

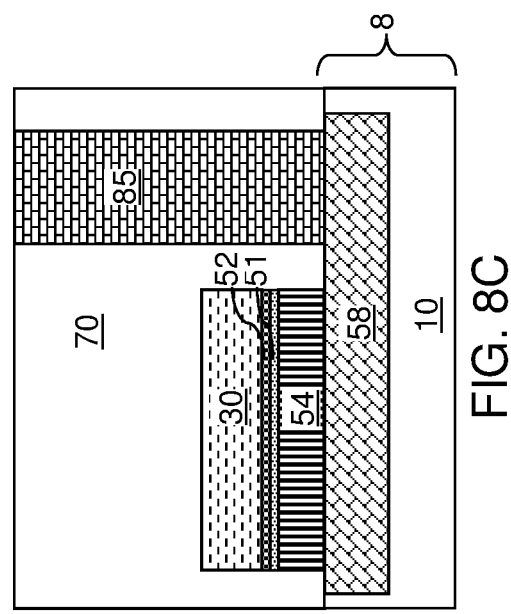

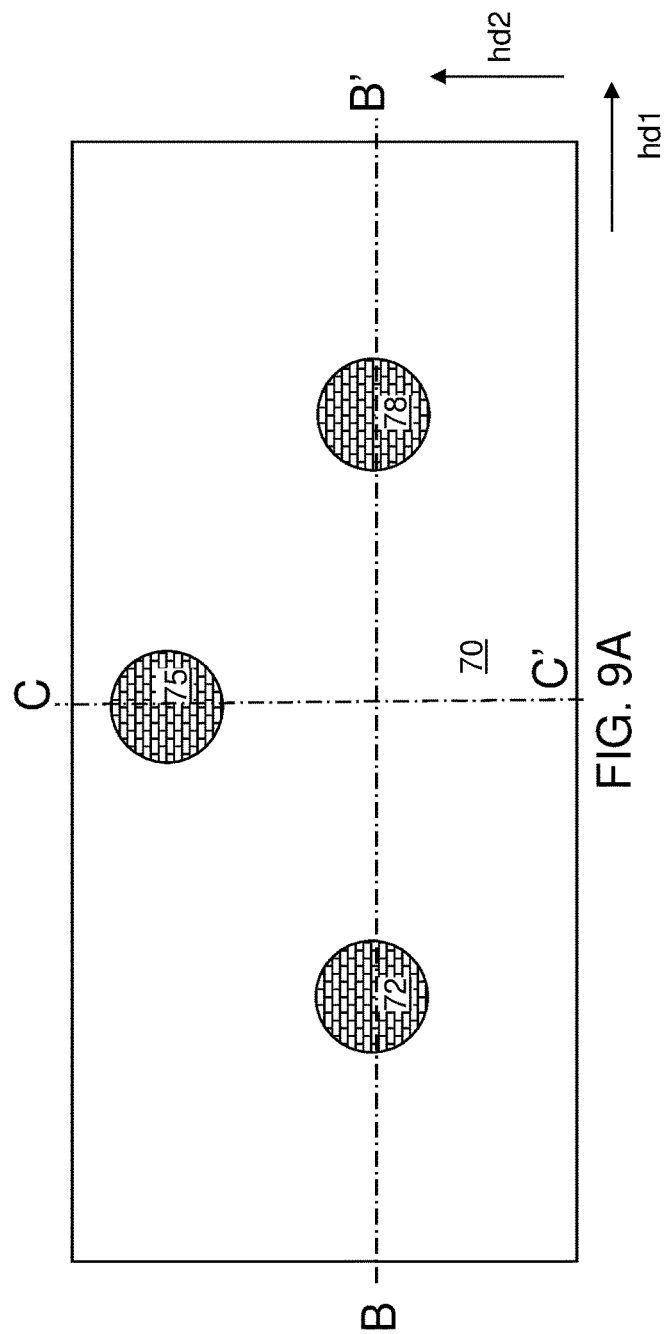
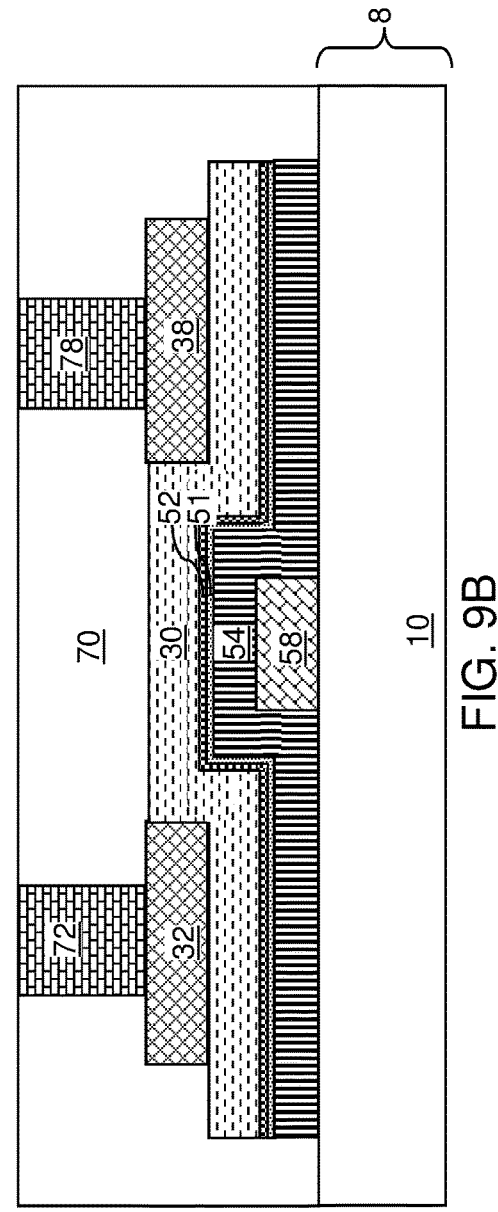
FIG. 9A
FIG. 9B

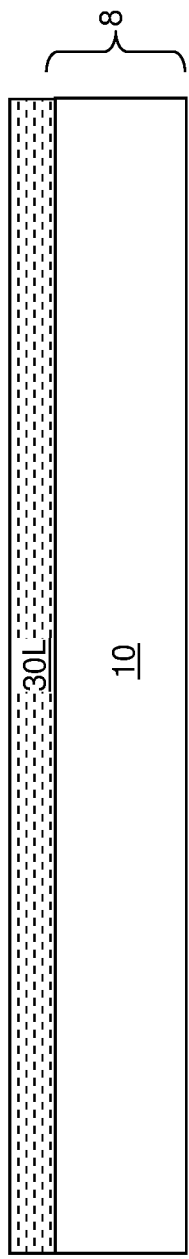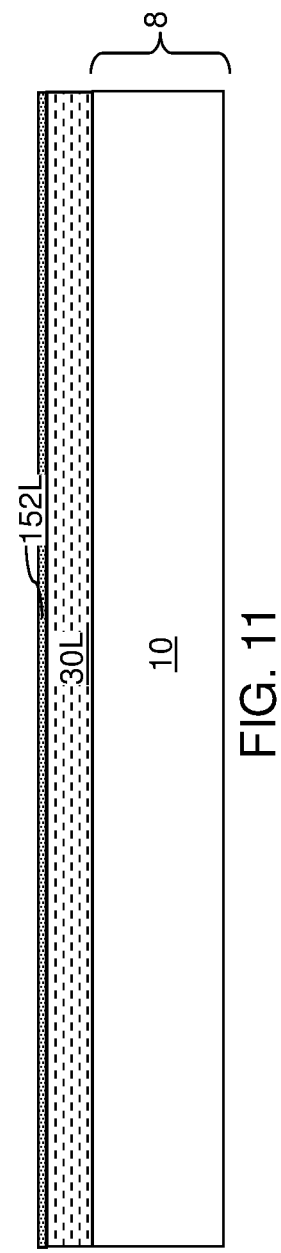

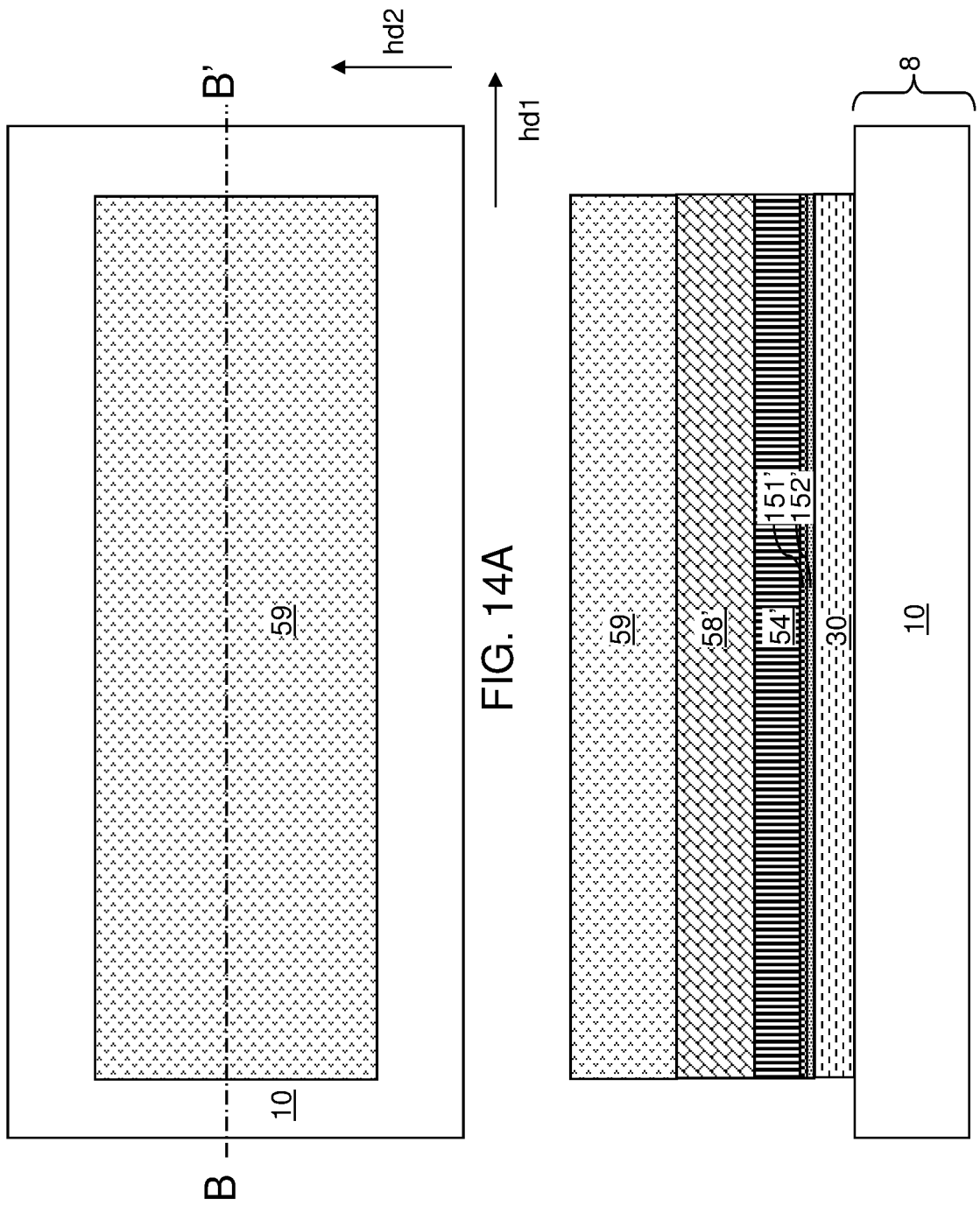

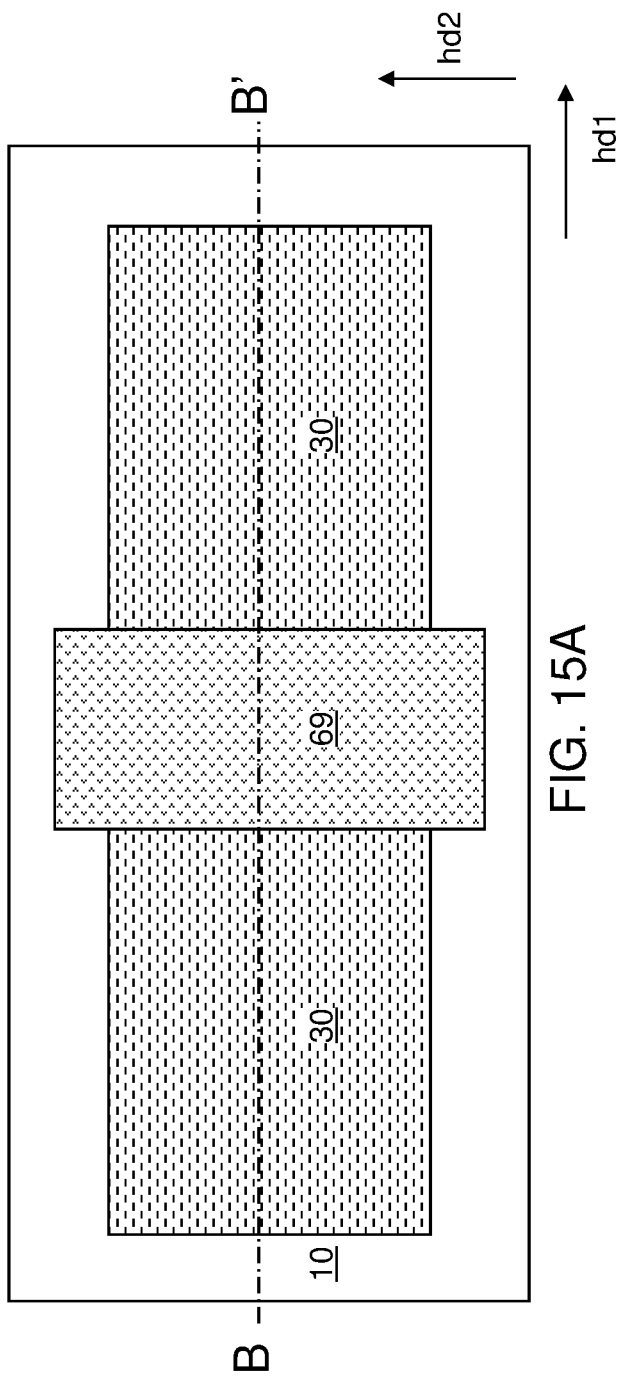
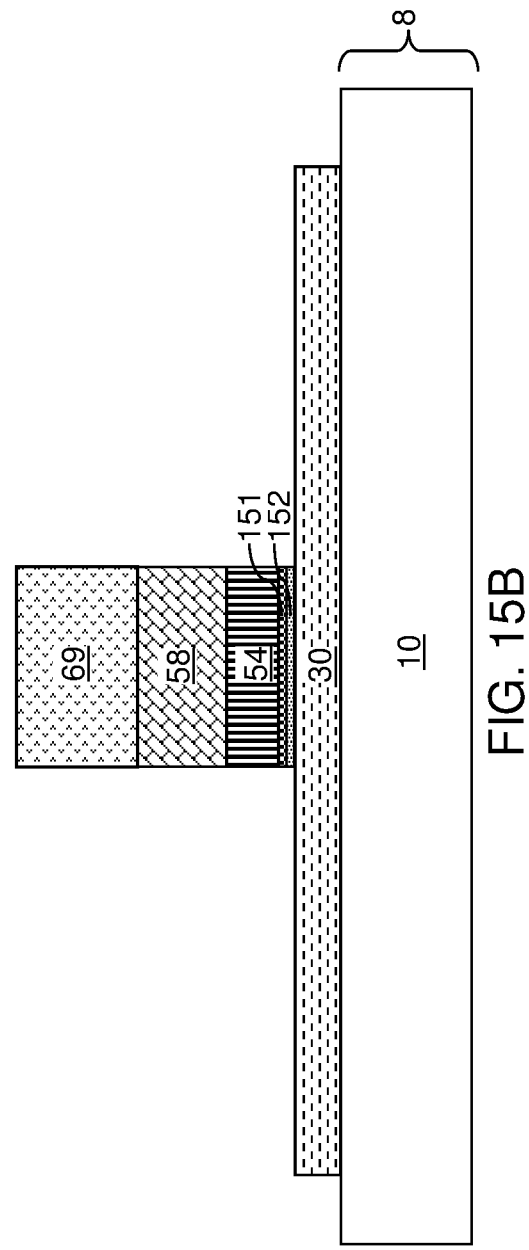
FIG. 15A
FIG. 15B

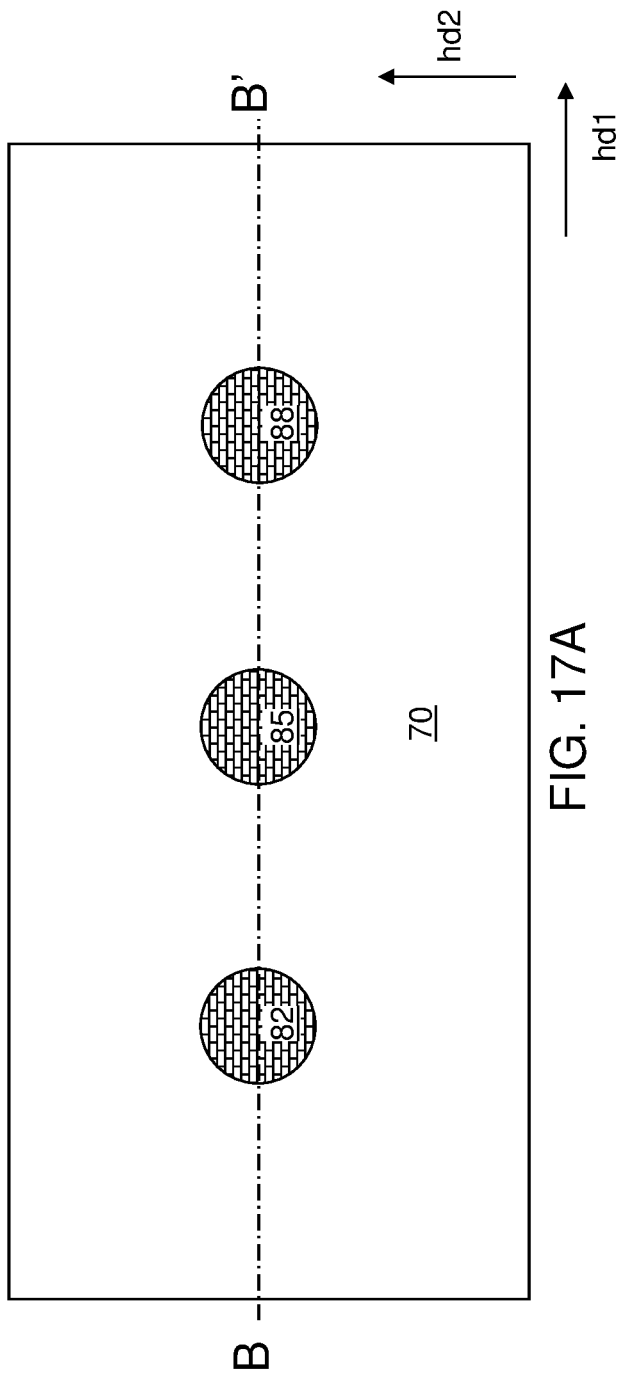
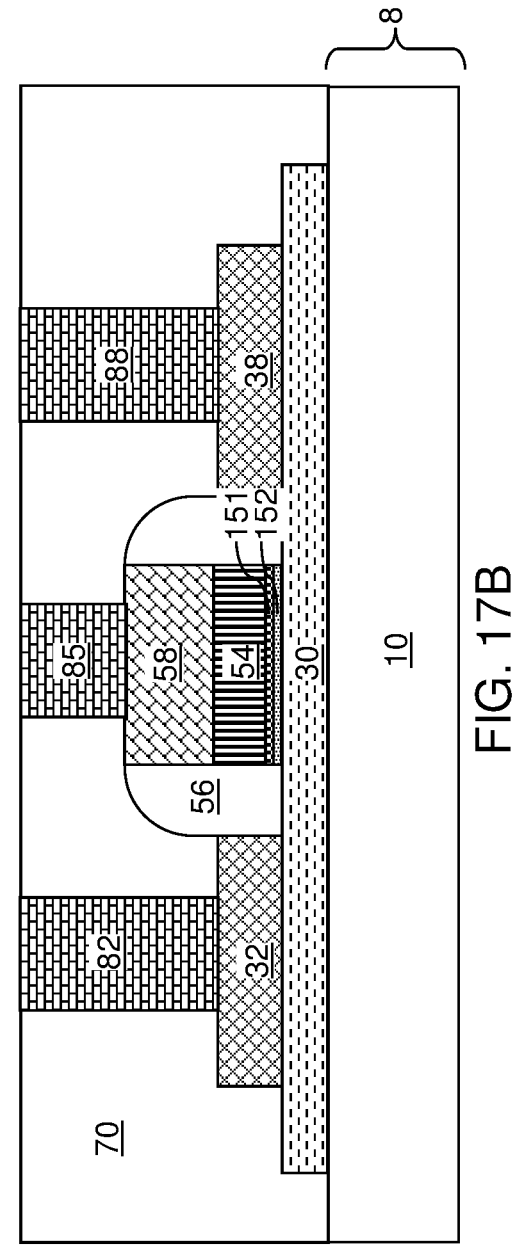
FIG. 17A
FIG. 17B

INTERFACIAL DUAL PASSIVATION LAYER FOR A FERROELECTRIC DEVICE AND METHODS OF FORMING THE SAME

RELATED APPLICATIONS

This application claims the benefit of priority from U.S. Provisional Application No. 63/042,598 entitled "Oxide Semiconductor Device with Enhanced Surface Passivation and Method of Fabricating the Same" filed on Jun. 23, 2020, the entire contents of which are hereby incorporated by reference for all purposes.

BACKGROUND

A ferroelectric material is a material that may have spontaneous nonzero electrical polarization (i.e., non-zero total electrical dipole moment) when the external electrical field is zero. The spontaneous electrical polarization may be reversed by a strong external electric field applied in the opposite direction. The electrical polarization is dependent not only on the external electrical field at the time of measurement, but also on the history of the external electrical field, and thus, has a hysteresis loop. The maximum of the electrical polarization is referred to as saturation polarization. The electrical polarization that remains after an external electrical field that induces saturation polarization is no longer applied (i.e., turned off) is referred to as remnant polarization. The magnitude of the electrical field that needs to be applied in the opposite direction of the remnant polarization in order to achieve zero polarization is referred to as coercive electrical field. For the purposes of forming memory devices, it is generally desirable to have high remnant polarization and high coercive field. High remnant polarization may increase the magnitude of an electrical signal. High coercive field makes the memory devices more stable against perturbations caused by noise-level electrical field and interferences.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 1A is a top-down view of a first exemplary structure after formation of a gate electrode in an upper portion of an insulating material layer over a substrate according to a first embodiment of the present disclosure.

FIG. 1B is a vertical cross-sectional view of the first exemplary structure along the plane B-B' of FIG. 1A.

FIG. 2 is a vertical cross-sectional view of the first exemplary structure after deposition of a ferroelectric dielectric material layer according to the first embodiment of the present disclosure.

FIG. 3 is a vertical cross-sectional view of the first exemplary structure after formation of a metal-rich metal oxide material layer according to the first embodiment of the present disclosure.

FIG. 4 is a vertical cross-sectional view of the first exemplary structure after formation of a dielectric metal nitride material layer according to the first embodiment of the present disclosure.

FIG. 5 is a vertical cross-sectional view of the first exemplary structure after deposition of a metal oxide semiconductor material layer according to the first embodiment of the present disclosure.

FIG. 6A is a top-down view of the first exemplary structure after patterning the metal oxide semiconductor material layer, the dielectric metal nitride material layer, the metal-rich metal oxide material layer, and the ferroelectric dielectric material layer according to the first embodiment of the present disclosure.

FIG. 6B is a vertical cross-sectional view of the first exemplary structure along the plane B-B' of FIG. 6A.

FIG. 7A is a top-down view of the first exemplary structure after formation of a source region and a drain region according to the first embodiment of the present disclosure.

FIG. 7B is a vertical cross-sectional view of the first exemplary structure along the plane B-B' of FIG. 7A.

FIG. 8A is a top-down view of the first exemplary structure after formation of a contact-level dielectric layer and contact via structures according to the first embodiment of the present disclosure.

FIG. 8B is a vertical cross-sectional view of the first exemplary structure along the plane B-B' of FIG. 8A.

FIG. 8C is a vertical cross-sectional view of the first exemplary structure along the plane C-C' of FIG. 8A.

FIG. 9A is a top-down view of an alternative configuration of the first exemplary structure according to the first embodiment of the present disclosure.

FIG. 9B is a vertical cross-sectional view of the first exemplary structure along the plane B-B' of FIG. 9A.

FIG. 10 is a vertical cross-sectional view of a second exemplary structure after deposition of a metal oxide semiconductor material layer on a top surface of an insulating material layer over a substrate according to a second embodiment of the present disclosure.

FIG. 11 is a vertical cross-sectional view of the second exemplary structure after formation of a dielectric metal nitride material layer according to the second embodiment of the present disclosure.

FIG. 14A is a top-down view of the second exemplary structure after patterning the gate electrode material layer, the ferroelectric dielectric material layer, the metal-rich metal oxide material layer, the dielectric metal nitride material layer, and the metal oxide semiconductor material layer according to the second embodiment of the present disclosure.

FIG. 14B is a vertical cross-sectional view of the second exemplary structure along the plane B-B' of FIG. 14A.

FIG. 15A is a top-down view of the second exemplary structure after formation of a gate electrode, a ferroelectric dielectric layer, a metal-rich metal oxide layer, and a dielectric metal nitride layer according to the second embodiment of the present disclosure.

FIG. 15B is a vertical cross-sectional view of the second exemplary structure along the plane B-B' of FIG. 15A.

FIG. 17A is a top-down view of the second exemplary structure after formation of a contact-level dielectric layer and contact via structures according to the second embodiment of the present disclosure.

FIG. 17B is a vertical cross-sectional view of the second exemplary structure along the plane B-B' of FIG. 17A.

DETAILED DESCRIPTION

Figure 12:
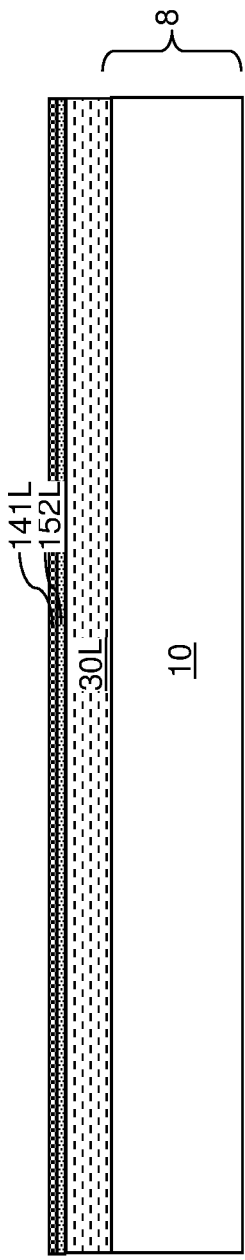
FIG. 12 is a vertical cross-sectional view of the second exemplary structure after deposition of a metal layer according to the second embodiment of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. Unless explicitly stated otherwise, each element having the same reference numeral is presumed to have the same material composition and to have a thickness within a same thickness range.

The present disclosure is directed to generally to semiconductor devices, and specifically to ferroelectric field effect transistors (FeFETs) including an interfacial material layer between a ferroelectric dielectric layer and a metal oxide semiconductor material layer for improving ferroelectric characteristics of the ferroelectric dielectric layer and method of forming the same. The interfacial material layer may comprise an interfacial dual passivation layer including a layer stack of a metal-rich metal oxide layer and a dielectric metal nitride layer.

In a conventional FeFET, a ferroelectric material may be deposited over a metal oxide semiconductor (e.g., Indium-Gallium-Zinc-Oxide (IGZO)) material. The metal oxide semiconductor surfaces may be rough and dominated by either oxygen or metal atoms in varying concentrations. The ferroelectric and metal oxide semiconductor interface may have interfacial excess metal ions, which form metal-metal bonds. In addition, the oxygen content at the ferroelectric and metal oxide semiconductor interface may also vary. Oxygen deficiency at the ferroelectric and metal oxide semiconductor interface may promote oxygen switching, while an excess of oxygen at the ferroelectric and metal oxide semiconductor interface may hinder oxygen movement in the ferroelectric layer. Controlling interfacial oxygen concentrations at the ferroelectric and metal oxide semiconductor interface impacts that ability to achieve ferroelectric devices with uniform switching.

The interfacial dual passivation layer of the various embodiments disclosed herein may be formed by formation of a metal-rich metal oxide layer on a ferroelectric dielectric material layer followed by a nitridation treatment of the metal-rich metal oxide layer. Alternatively, the interfacial dual passivation layer may be formed by a nitridation treatment of the metal oxide semiconductor layer followed by deposition of a metal layer having an atomic-level thickness. The metal layer may be converted into a metal-rich metal oxide layer upon deposition of a ferroelectric dielectric material layer thereupon.

The interfacial dual passivation layer of the present disclosure reduces variability in the ferroelectric characteristics of the ferroelectric dielectric material layer. Further, the interfacial dual passivation layer of the present disclosure stabilizes the interface between the ferroelectric dielectric material layer and the metal oxide semiconductor material layer. Thus, the interfacial dual passivation layer of the present disclosure provides uniformity in device characteristics of a ferroelectric memory device. Metal-metal coordination is reduced at the interface between the ferroelectric dielectric material layer and the metal oxide semiconductor material layer. Further, excess oxygen at the interface may bond with the metal-rich metal oxide layer, and ferroelectric switching in the ferroelectric dielectric material layer is facilitated. The various aspects of embodiments of the present disclosure are now described in detail with reference to accompanying drawings.

FIG. 1A is a top-down view of a first exemplary structure after formation of a gate electrode in an upper portion of an insulating material layer over a substrate according to a first embodiment of the present disclosure. FIG. 1B is a vertical cross-sectional view of the first exemplary structure along the plane B-B' of FIG. 1A. Referring to FIGS. 1A and 1B, a first exemplary structure according to a first embodiment of the present disclosure includes a substrate 8 including an insulating material layer 10 at an upper portion thereof. The substrate 8 may include additional material portions under the insulating material layer 10. For example, the substrate 8 may include a commercially available semiconductor wafer within semiconductor devices (such as field effect transistors) on an upper surface thereof. The insulating material layer 10 may include interlayer dielectric (ILD) material layers having formed therein metal semiconductor structures (such as metal lines and metal via structures) therein. Alternatively, the substrate 8 may comprise an insulating substrate that includes the insulating material layer 10 as an upper portion or as an entirety thereof. Generally, the substrate 8 has a thickness that may provide structural integrity to the devices to be subsequently formed thereupon. For example, the substrate 8 may have a thickness in a range from 30 microns to 1 mm. The thickness of the insulating material layer 10 may be in a range from 100 nm to 1 mm depending on the configuration and the composition of the substrate 8. In an illustrative example, the insulating material layer 10 may include a dielectric material such as silicon oxide, silicon nitride, organosilicate glass, quartz, etc. Other insulating materials are also within the contemplated scope of disclosure.

In one embodiment, the substrate 8 may include a combination of a single crystalline semiconductor substrate (such as a commercially available single crystalline silicon substrate), semiconductor devices (such as filed effect transistors including single crystalline semiconductor channels) located on a top surface of the single crystalline semiconductor substrate, and interconnect-level dielectric material layers embedding metal interconnect structures that are electrically connected to various nodes of the semiconductor devices located on the top surface of the single crystalline substrate. In this case, the insulating material layer 10 may include one or more of the interconnect-level dielectric material layers, and the structures formed above the insulating material layer 10 can be formed as a back-end-of-line (BEOL) structures.

A recess region may be formed in an upper portion of the insulating material layer 10 by applying a photoresist layer (not shown) on a top surface of the insulating material layer 10, forming an opening in the photoresist layer by lithographically patterning the photoresist layer, and by anisotropically etching an upper portion of the insulating material layer 10 using the photoresist layer as an etch mask. The recess region may have a depth in a range from 50 nm to 500 nm, although lesser and greater depths may also be used. In one embodiment, the recess region may have a rectangular shape. In this embodiment, the lateral dimension of a first side of the recess region laterally extending along a first horizontal direction hd1 may be the same as the channel length of a thin film ferroelectric field effect transistor to be subsequently formed, and the lateral dimension of a second side of the recess region laterally extending along a second horizontal direction hd2 may be the same as the width of the channel of the thin film ferroelectric field effect transistor to be subsequently formed. In an illustrative example, the lateral dimension of the first side of the recess region along the first horizontal direction hd1 may be in a range from 20 nm to 200 nm, and the lateral dimension of the second side of the recess region along the second horizontal direction hd2 may be in a range from 40 nm to 1,000 nm, although lesser and greater lateral dimensions may also be used. The photoresist layer may be subsequently removed, for example, by ashing.

A conductive material such as a heavily doped semiconductor material (such as heavily doped poly silicon), a transition metal, or a conductive metallic alloy of a transition metal (such as a conductive metallic nitride or a conductive metallic carbide) may be deposited in the recess region. Excess portions of the conductive material may be removed from above the horizontal plane including the top surface of the insulating material layer 10. A remaining portion of the conductive material that fills the recess region comprises a gate electrode 58. The gate electrode 58 may contact sidewalls and a recessed surface of the insulating material layer 10. In some instances, the gate electrode 58 may be referred to as a back gate electrode or a bottom gate electrode.

FIG. 2 is a vertical cross-sectional view of the first exemplary structure after deposition of a ferroelectric dielectric material layer according to the first embodiment of the present disclosure. Referring to FIG. 2, a ferroelectric dielectric material may be deposited on the top surface of the gate electrode 58 and on the top surface of the insulating material layer 10 to form a ferroelectric dielectric material layer 54L. The ferroelectric dielectric material layer 54L includes a ferroelectric material having two stable directions for electrical polarization. The two stable directions may be the upward direction and the downward direction, or may be a set of two opposite directions having a tilt angle with respect to the vertical direction. The ferroelectric material of the ferroelectric dielectric material layer 54L may include at least one material selected from barium titanate, colemanite, bismuth titanate, europium barium titanate, ferroelectric polymer, germanium telluride, langbeinite, lead scandium tantalate, lead titanate, lead zirconate titanate, lithium niobate, polyvinylidene fluoride, potassium niobate, potassium sodium tartrate, potassium titanyl phosphate, sodium bismuth titanate, lithium tantalate, lead lanthanum titanate, lead lanthanum zirconate titanate, ammonium dihydrogen phosphate, and potassium dihydrogen phosphate. Other suitable materials are within the contemplated scope of disclosure. The ferroelectric dielectric material layer 54L may be deposited, for example, by physical vapor deposition. The thickness of the ferroelectric dielectric material layer 54L may be in a range from 2 nm to 30 nm, such as from 4 nm to 15 nm, although lesser and greater thicknesses may also be used. The gate electrode 58 may contact a first portion of the insulating material layer 10, and the ferroelectric dielectric material layer 54L may contact a second portion of the insulating material layer 10.

FIG. 3 is a vertical cross-sectional view of the first exemplary structure after formation of a metal-rich metal oxide material layer according to the first embodiment of the present disclosure. Referring to FIG. 3, a metal-rich metal oxide material layer 51L may be formed on the top surface of the ferroelectric dielectric material layer 54L. In one embodiment, the metal-rich metal oxide material layer 51L may be formed by depositing a metal layer including a metallic element on the ferroelectric dielectric material layer 54L, and by oxidizing the atoms of the metallic element. In this embodiment, the atoms of the metallic element may be oxidized by combining with oxygen atoms within the ferroelectric dielectric material layer 54L. The metallic elements may be different from, or may be the same as, a metallic element that is present within the ferroelectric dielectric material layer 54L. Further, the metallic element may be different from, or may be the same as, a metallic element within a metal oxide semiconductor material layer to be subsequently deposited.

The metallic element of the metal layer may be a transition metal element or a non-transition metal element. In one embodiment, the metallic element may be selected such that the metallic element does not interdiffuse into the ferroelectric dielectric material of the ferroelectric dielectric material layer 54L, the metallic element does not perturb the phase stability of the lattice structure of the ferroelectric dielectric material of the ferroelectric dielectric material layer 54L significantly, and the metallic element does not form trap level energy states that may increase leakage current.

For example, the metallic element of the metal layer that is deposited to form the metal-rich metal oxide material layer 51L may be selected from Hf, Al, Ti, Zr, and Ga. The metal layer may be deposited by a conformal deposition process such as atomic layer deposition. The thickness of the metal layer may be in a range from 0.1 nm to 0.6 nm, such as from 0.2 nm to 0.5 nm, although lesser and greater thicknesses may also be used. The thickness of the metal layer refers to the ratio of the total number of metal atoms per unit area of the metal layer to the total number of metal atoms per unit volume in the bulk state of the metal within the metal layer. In one embodiment, the ferroelectric dielectric material layer 54L may comprise a dielectric metal oxide of a transition metal that is different from the metallic element within the metal layer. In one embodiment, the metallic element in the metal layer may be different from any metallic element that is present within a metal oxide semiconductor layer to be subsequently deposited.

The metal-rich metal oxide material layer 51L includes a non-stoichiometric and metal-rich oxide of the metallic element of the metal layer. In other words, the thickness of the metal layer may be selected such that not every atom of the metallic element in the metal layer may fully combine with oxygen atoms on the surface of the ferroelectric dielectric material layer 54L. Thus, the average coordination of the atoms of the metallic element within the metal-rich metal oxide material layer 51L may be less than the coordination number for the metallic element in the state of full oxidation. In an illustrative example, if the metallic element in the metal-rich metal oxide material layer 51L includes Hf, Ti or Zr, the average oxygen coordination number may be less than 2, and may be in a range from 0.5 to 1.8. If the metallic element in the metal-rich metal oxide material layer 51L includes Al or Ga, the average oxygen coordination number is less than 1.5, and may be in a range from 0.3 to 1.2. Thus, the oxide material of the metallic element within the metal-rich metal oxide material layer 51L eliminates oxygen deficiency conditions at the top surface of the ferroelectric dielectric material layer 54L.

FIG. 4 is a vertical cross-sectional view of the first exemplary structure after formation of a dielectric metal nitride material layer according to the first embodiment of the present disclosure. Referring to FIG. 4, a dielectric metal nitride material layer 52L may be formed by nitridating an upper portion of the metal-rich metal oxide material layer 51L. The first exemplary structure may be disposed in a nitridation process chamber, and a nitridation agent gas such as ammonia or nitrogen gas may be flowed into the nitridation process chamber. A plasma nitridation process or a thermal nitridation process may be performed to convert a surface portion of the metal-rich metal oxide material layer 51L into the dielectric metal nitride material layer 52L. Thus, the dielectric metal nitride material layer 52L includes a dielectric metal nitride of the metallic element within the metal-rich metal oxide material layer 51L. The nitridation process is more effective at the top portion of the metal-rich metal oxide material layer 51L than at the bottom portion of the metal-rich metal oxide material layer 51L because the nitrogen atoms that induce nitridation are supplied from the plasma or from a gas ambient in the nitridation process chamber. In one embodiment, the dielectric metal nitride material layer 52L may be a continuous monolayer of a dielectric metal nitride material. In one embodiment, the dielectric metal nitride material layer 52L may be stoichiometric, and may comprise metal atoms and nitrogen atoms at a 1:1 atomic ratio. In one embodiment, the metal atoms may be selected from Hf, Al, Ti, Zr, and Ga. In one embodiment, the dielectric metal nitride material layer 52L may include a continuous monolayer of stoichiometric HfN. The thickness of the metal-rich metal oxide material layer 51L after the nitridation process may be in a range from 0.1 nm to 0.5 nm, such as from 0.2 nm to 0.4 nm, although lesser and greater thicknesses may also be used. The thickness of the dielectric metal nitride material layer 52L may be in a range from 0.2 nm to 0.4 nm.

FIG. 5 is a vertical cross-sectional view of the first exemplary structure after deposition of a metal oxide semiconductor material layer according to the first embodiment of the present disclosure. Referring to FIG. 5, a metal oxide semiconductor material layer 30L may be deposited over the dielectric metal nitride material layer 52L. The metal oxide semiconductor material layer 30L includes a metal oxide semiconductor material such as indium gallium zinc oxide (IGZO), doped zinc oxide, doped indium oxide, or doped cadmium oxide with a high level of doping. Other metal oxide semiconducting materials may be within the contemplated scope of this disclosure. The metal oxide semiconductor material layer 30L may be deposited by physical vapor deposition. The dopant concentration in the metal oxide semiconductor material layer 30L may be in a range from $1.0 \times 10^{12}/cm^3$ to $1.0 \times 10^{18}/cm^3$, although lesser and greater dopant concentrations may also be used. The thickness of the metal oxide semiconductor material layer 30L may be in a range from 10 nm to 100 nm, such as from 20 nm to 50 nm, although lesser and greater thicknesses may also be used.

FIG. 6A is a top-down view of the first exemplary structure after patterning the metal oxide semiconductor material layer, the dielectric metal nitride material layer, the metal-rich metal oxide material layer, and the ferroelectric dielectric material layer according to the first embodiment of the present disclosure. FIG. 6B is a vertical cross-sectional view of the first exemplary structure along the plane B-B' of FIG. 6A. Referring to FIGS. 6A and 6B, a photoresist layer 59 may be applied over the metal oxide semiconductor material layer 30L, and may be lithographically patterned to cover a rectangular area that straddles the area of the gate electrode 58. An anisotropic etch process may be performed to transfer the pattern in the photoresist layer 59 through the metal oxide semiconductor material layer 30L, the dielectric metal nitride material layer 52L, the metal-rich metal oxide material layer 51L, and the ferroelectric dielectric material layer 54L. A patterned portion of the metal oxide semiconductor material layer 30L includes a metal oxide semiconductor layer 30. A patterned portion of the dielectric metal nitride material layer 52L includes a dielectric metal nitride layer 52. A patterned portion of the metal-rich metal oxide material layer 51L includes a metal-rich metal oxide layer 51. A patterned portion of the ferroelectric dielectric material layer 54L includes a ferroelectric dielectric layer 54. A layer stack including the ferroelectric dielectric layer 54, the metal-rich metal oxide layer 51, the dielectric metal nitride layer 52, and the metal oxide semiconductor layer 30 may be formed. The layer stack of the ferroelectric dielectric layer 54, the metal-rich metal oxide layer 51, the dielectric metal nitride layer 52, and the metal oxide semiconductor layer 30 constitutes a gate dielectric. Sidewalls of the layers within the layer stack (54, 51, 52, 30) may be vertically coincident, i.e., may be located within same vertical planes. A portion of the gate electrode 58 may laterally protrude along the second horizontal direction hd2 outside the area of the layer stack (54, 51, 52, 30), and a top surface of the gate electrode 58 may be physically exposed. The photoresist layer 59 may be subsequently removed, for example, by ashing.

FIG. 7A is a top-down view of the first exemplary structure after formation of a source region and a drain region according to the first embodiment of the present disclosure. FIG. 7B is a vertical cross-sectional view of the first exemplary structure along the plane B-B' of FIG. 7A. Referring to FIGS. 7A and 7B, a conductive material may be deposited on portions of the top surface of the metal oxide semiconductor layer 30 to form a source region 32 and a drain region 38. The conductive material may include a metallic material such as TiN, TaN, or WN; a layer stack of multiple metallic materials, or a heavily doped semiconductor material. Other conductive materials are within the contemplated scope of disclosure. In one embodiment, the conductive material may be deposited as a continuous material layer over the metal oxide semiconductor layer, and a pair of patterned photoresist material portions may be formed in areas that are laterally offset from the area of the gate electrode 58. Unmasked portions of the conductive material may be etched using an etch process that etches the conductive material selective to the materials of the metal oxide semiconductor layer 30 and the insulating material layer 10. The etch process may include an anisotropic etch process or an isotropic etch process. Alternatively, a photoresist material may be applied over the top surface of the metal oxide semiconductor layer 30, and may be lithographically patterned to form openings therein in areas that are laterally offset from the area of the gate electrode 58. The conductive material may be deposited in the openings in the photoresist material, and portions of the conductive material overlying the photoresist material may be lifted off by application of a solvent that removes the photoresist material.

The source region 32 may be formed directly on a first portion of the metal oxide semiconductor layer 30 that is laterally offset from the gate electrode 58, and the drain region 38 may be formed directly on a second portion of the metal oxide semiconductor layer 30 that is laterally offset from the gate electrode 58 and the source region 32. Thus, the source region 32 contacts a first portion of the top surface of metal oxide semiconductor layer 30 that is laterally offset from the gate electrode 58, and the drain region 38 contacts a second portion of the metal oxide semiconductor layer 30 that is laterally offset from the gate electrode 58 and the source region 32. The thickness of the source region 32 and the drain region 38 may be in a range from 30 nm to 300 nm, such as from 60 nm to 150 nm, although lesser and greater thicknesses may also be used.

FIG. 8A is a top-down view of the first exemplary structure after formation of a contact-level dielectric layer and contact via structures according to the first embodiment of the present disclosure. FIG. 8B is a vertical cross-sectional view of the first exemplary structure along the plane B-B' of FIG. 8A. FIG. 8C is a vertical cross-sectional view of the first exemplary structure along the plane C-C' of FIG. 8A. Referring to FIGS. 8A-8C, a dielectric material may be deposited over the metal oxide semiconductor layer 30, the source region 32, and the drain region 38 to form a contact-level dielectric layer 70. The dielectric material may include a planarizable dielectric material such as undoped silicate glass or a doped silicate glass, or a self-planarizing dielectric material such as flowable oxide (FOX). The dielectric material may be deposited by a chemical vapor deposition process (such as a plasma-enhanced chemical vapor deposition process) or by spin coating. The top surface of the dielectric material may be planarized during, or after, the deposition process. The vertical distance between the top surface of the contact-level dielectric layer 70 and the top surfaces of the source region 32 and the drain region 38 may be in a range from 30 nm to 400 nm, although lesser and greater thicknesses may also be used.

A photoresist layer (not shown) may be applied over the contact-level dielectric layer 70, and may be lithographically patterned to form discrete openings therethrough. The openings in the photoresist layer may be formed over the source regions 32, the drain regions 38, and the gate electrode 58. An anisotropic etch process may be performed to form contact via cavities through the contact-level dielectric layer 70.

At least one metallic material may be deposited in the contact via cavities. The at least one metallic material may include a combination of a metallic liner and a metallic fill material. The metallic liner may include a conducive metallic nitride material (such as TiN, TaN, or WN) and/or a metallic carbide material (such as TiC, TaC, or WC). The thickness of the metallic liner may be in a range from 3 nm to 15 nm, although lesser and greater thicknesses may also be used. The metallic fill material includes a metal having high electrical conductivity. For example, the metallic fill material may include an elemental metal such as Cu, W, Mo, Co, Ru, and/or another elemental metal or an intermetallic alloy. Other metallic fill materials are within the contemplated scope of disclosure. Portions of the at least one metallic material located above the horizontal plane including the top surface of the contact-level dielectric layer 70 may be removed by a planarization process. Each combination of a remaining portion of the metallic fill material and the metallic liner that fills a respective one of the contact via cavities constitutes a contact via structure (82, 88, 85). The contact via structures (82, 88, 85) include a source contact via structure 82 contacting the source region 32, a drain contact via structure 88 contacting the drain region 38, and gate contact via structures 85 contacting the gate electrode 58.

FIG. 9A is a top-down view of an alternative configuration of the first exemplary structure according to the first embodiment of the present disclosure. FIG. 9B is a vertical cross-sectional view of the first exemplary structure along the plane B-B' of FIG. 9A. Referring to FIGS. 9A and 9B, an alternative configuration of the first exemplary structure according to the first embodiment of the present disclosure may be derived from the first exemplary structure of FIGS. 8A-8C by forming a gate electrode on a top surface of the insulating material layer 10 without forming a recess region in the insulating material layer 10 at the processing steps of FIGS. 1A and 1B. In this embodiment, a conductive material layer may be deposited over the top surface of the insulating material layer 10, and may be patterned by a combination of a lithographic patterning step that forms a patterned photoresist material portion and an etch process that removes unmasked portions of the conductive material layer that are not masked by the patterned photoresist material portion. The remaining patterned portion of the conductive material layer comprises a gate electrode 58. Subsequently, the processing steps of FIGS. 2-8C may be performed to form the alternative embodiment of the first exemplary structure. In this embodiment, the gate electrode 58 contacts a first portion of the top surface of the insulating material layer 10, and the ferroelectric dielectric layer 54 contacts a second portion of the top surface of the insulating material layer 10.

The first portion of the top surface of the insulating material layer 10 and the second portion of the top surface of the insulating material layer 10 may be located within a same horizontal plane.

A photoresist layer (not shown) may be applied over the contact-level dielectric layer 70, and may be lithographically patterned to form discrete openings therethrough. The openings in the photoresist layer may be formed over the source regions 32, the drain regions 38, and the gate electrode 58. An anisotropic etch process may be performed to form contact via cavities through the contact-level dielectric layer 70.

At least one metallic material may be deposited in the contact via cavities. The at least one metallic material may include a combination of a metallic liner and a metallic fill material. The metallic liner may include a conducive metallic nitride material (such as TiN, TaN, or WN) and/or a metallic carbide material (such as TiC, TaC, or WC). The thickness of the metallic liner may be in a range from 3 nm to 15 nm, although lesser and greater thicknesses may also be used. The metallic fill material includes a metal having high electrical conductivity. For example, the metallic fill material may include an elemental metal such as Cu, W, Mo, Co, Ru, and/or another elemental metal or an intermetallic alloy. Other metallic fill materials are within the contemplated scope of disclosure. Portions of the at least one metallic material located above the horizontal plane including the top surface of the contact-level dielectric layer 70 may be removed by a planarization process. Each combination of a remaining portion of the metallic fill material and the metallic liner that fills a respective one of the contact via cavities constitutes a contact via structure (72, 78, 75). The contact via structures (72, 78, 75) include a source contact via structure 72 contacting the source region 32, a drain contact via structure 78 contacting the drain region 38, and gate contact via structures 75 contacting the gate electrode 58.

FIG. 10 is a vertical cross-sectional view of a second exemplary structure after deposition of a metal oxide semiconductor material layer on a top surface of an insulating material layer over a substrate according to a second embodiment of the present disclosure. Referring to FIG. 10, a second exemplary structure according to a second embodiment of the present disclosure is illustrated, which comprises a substrate 8 including an insulating material layer 10 and a metal oxide semiconductor material layer 30L formed thereupon. The second exemplary structure of FIG. 10 may be formed by providing the substrate with the insulating material layer 10 therein, and by depositing the metal oxide semiconductor material layer 30L on the top surface of the insulating material layer 10 in the substrate 8. Generally, each of the substrate 8, the insulating material layer 10, and the metal oxide semiconductor material layer 30L may have the same material composition and the same thickness as in the first embodiment. A planar bottom surface of the metal oxide semiconductor material layer 30L may contact the top surface of the insulating material layer 10.

FIG. 11 is a vertical cross-sectional view of the second exemplary structure after formation of a dielectric metal nitride material layer according to the second embodiment of the present disclosure. Referring to FIG. 11, a dielectric metal nitride material layer 152L may be formed by nitridating a surface portion of the metal oxide semiconductor material layer 30L. The second exemplary structure may be disposed in a nitridation process chamber, and a nitridation agent gas such as ammonia or nitrogen gas may be flowed into the nitridation process chamber. A plasma nitridation process or a thermal nitridation process may be performed to convert a surface portion of the metal oxide semiconductor material layer 30L into the dielectric metal nitride material layer 152L. Thus, the dielectric metal nitride material layer 152L includes a dielectric metal nitride of the metallic element within the metal oxide semiconductor material layer 30L. The nitridation process is more effective at the surface portion of the metal oxide semiconductor material layer 30L than underneath the surface portion of the metal-rich metal oxide material layer 51L because the nitrogen atoms that induce nitridation are supplied from the plasma or from a gas ambient in the nitridation process chamber. In one embodiment, the dielectric metal nitride material layer 152L may be a continuous monolayer of a dielectric metal nitride material. In one embodiment, the dielectric metal nitride material layer 152L may be stoichiometric, and may comprise metal atoms and nitrogen atoms at a 1:1 atomic ratio. In one embodiment, the metal atoms may be selected from Hf, Al, Ti, Zr, and Ga. In one embodiment, the dielectric metal nitride material layer 152L may include a continuous monolayer of stoichiometric HfN. The thickness of the dielectric metal nitride material layer 152L may be in a range from 0.2 nm to 0.4 nm.

FIG. 12 is a vertical cross-sectional view of the second exemplary structure after deposition of a metal layer according to the second embodiment of the present disclosure. Referring to FIG. 12, a metal layer 141L may be formed on the top surface of the dielectric metal nitride material layer 152L, for example, by chemical vapor deposition, atomic layer deposition, or physical vapor deposition. The metal layer 141L includes a metallic element that may be subsequently oxidized upon subsequent deposition of a ferroelectric dielectric metal oxide material thereupon by combining with oxygen atoms within the ferroelectric dielectric metal oxide material. The metallic elements may be different from, or may be the same as, a metallic element that is present within the metal oxide semiconductor material layer 30L. Further, the metallic element may be different from, or may be the same as, a metallic element within a ferroelectric dielectric material to be subsequently deposited thereupon.

The metallic element of the metal layer may be a transition metal element or a non-transition metal element. For example, the metallic element of the metal layer 141L may be selected from Hf, Al, Ti, Zr, and Ga. The metal layer 141L may be deposited by a conformal deposition process such as atomic layer deposition. The thickness of the metal layer 141L may be in a range from 0.1 nm to 0.4 nm, such as from 0.15 nm to 0.3 nm, although lesser and greater thicknesses may also be used. The thickness of the metal layer 141L refers to the ratio of the total number of metal atoms per unit area of the metal layer 141L to the total number of metal atoms per unit volume in the bulk state of the metal within the metal layer 141L.

Figure 13:
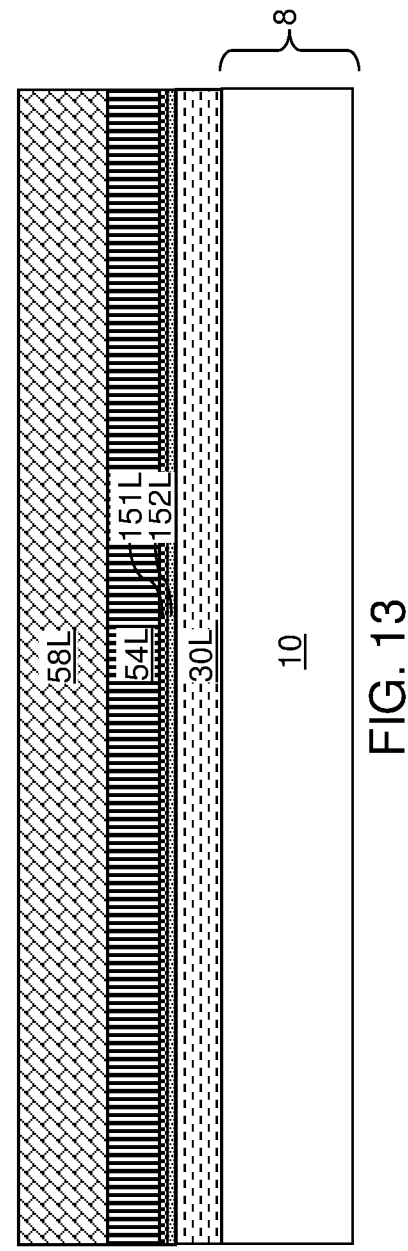
FIG. 13 is a vertical cross-sectional view of the second exemplary structure after formation of a ferroelectric dielectric material layer and a gate electrode material layer according to the second embodiment of the present disclosure.

FIG. 13 is a vertical cross-sectional view of the second exemplary structure after formation of a ferroelectric dielectric material layer and a gate electrode material layer according to the second embodiment of the present disclosure. Referring to FIG. 13, a ferroelectric dielectric material layer 54L and a gate electrode material layer 58L may be deposited over the metal layer 141L. The ferroelectric dielectric layer 54L may have the same material composition and the same thickness as in the first exemplary structure. Oxygen atoms in the bottom portion of the ferroelectric dielectric material layer 54L combines with metal atoms of the metal layer 141L, and converts the metal layer 141L into a metal-rich metal oxide material layer 151L. The metallic element of the metal layer may be a transition metal element or a non-transition metal element. For example, the metallic element of the metal-rich metal oxide material layer 151L may be selected from Hf, Al, Ti, Zr, and Ga. The thickness of the metal-rich metal oxide material layer 151L may be in a range from 0.1 nm to 0.5 nm, such as from 0.2 nm to 0.4 nm, although lesser and greater thicknesses may also be used. In one embodiment, the ferroelectric dielectric material layer 54L may comprise a dielectric metal oxide of a transition metal that is different from the metallic element within the metal-rich metal oxide material layer 151L. In one embodiment, the metallic element in the metal-rich metal oxide material layer 151L may be different from any metallic element that is present within the metal oxide semiconductor layer 30L.

The metal-rich metal oxide material layer 151L includes a non-stoichiometric and metal-rich oxide of the metallic element within the metal-rich metal oxide material layer 151L. In other words, not every atom of the metallic element in metal-rich metal oxide material layer 151L fully combines with oxygen atoms on the bottom surface of the ferroelectric dielectric material layer 54L. Thus, the average coordination of the atoms of the metallic element within the metal-rich metal oxide material layer 151L is less than the coordination number for the metallic element in the state of full oxidation. In an illustrative example, if the metallic element in the metal-rich metal oxide material layer 151L includes Hf, Ti or Zr, the average oxygen coordination number is less than 2, and may be in a range from 0.5 to 1.8. If the metallic element in the metal-rich metal oxide material layer 151L includes Al or Ga, the average oxygen coordination number is less than 1.5, and may be in a range from 0.3 to 1.2. Thus, the oxide material of the metallic element within the metal-rich metal oxide material layer 151L eliminates oxygen deficiency conditions at the bottom surface of the ferroelectric dielectric material layer 54L. In one embodiment, the dielectric metal nitride material layer 152L may be a continuous monolayer of a dielectric metal nitride. In one embodiment, the dielectric metal nitride material layer 152L may be stoichiometric, and may comprise metal atoms and nitrogen atoms at a 1:1 atomic ratio. In one embodiment, the metal atoms may be selected from Hf, Al, Ti, Zr, and Ga. In one embodiment, the dielectric metal nitride material layer 152L may include a continuous monolayer of stoichiometric HfN.

The gate electrode material layer 58L includes at least one gate electrode material, which may include at least one metallic nitride material (TiN, TaN, or WN), at least one elemental metal, at least one intermetallic alloy, a heavily doped semiconductor material, and/or a metal-semiconductor alloy material (such as a metal silicide). The thickness of the gate electrode material layer 58L may be in a range from 50 nm to 300 nm, although lesser and greater thicknesses may also be used.

FIG. 14A is a top-down view of the second exemplary structure after patterning the gate electrode material layer, the ferroelectric dielectric material layer, the metal-rich metal oxide material layer, the dielectric metal nitride material layer, and the metal oxide semiconductor material layer according to the second embodiment of the present disclosure. FIG. 14B is a vertical cross-sectional view of the second exemplary structure along the plane B-B' of FIG. 14A. Referring to FIGS. 14A and 14B, a photoresist layer 59 may be applied over the gate electrode material layer 58L, and may be lithographically patterned to cover a rectangular area. An anisotropic etch process may be performed to transfer the pattern in the photoresist layer 59 through the gate electrode material layer 58L, the ferroelectric dielectric material layer 54L, the metal-rich metal oxide material layer 151L, the dielectric metal nitride material layer 152L, and the metal oxide semiconductor material layer 30L. A patterned portion of the gate electrode material layer 58L includes an in-process gate electrode 58', which may be subsequently patterned further to form a gate electrode. A patterned portion of the ferroelectric dielectric material layer 54L includes an in-process ferroelectric dielectric layer 54'. A patterned portion of the metal-rich metal oxide material layer 151L includes an in-process metal-rich metal oxide layer 151'. A patterned portion of the dielectric metal nitride material layer 152L includes an in-process dielectric metal nitride layer 152'. A patterned portion of the metal oxide semiconductor material layer 30L includes a metal oxide semiconductor layer 30. A layer stack including the in-process gate electrode 58', the in-process ferroelectric dielectric layer 54', the in-process metal-rich metal oxide layer 151', the in-process dielectric metal nitride layer 152', and the metal oxide semiconductor layer 30 is formed. Sidewalls of the layers within the layer stack (54', 151', 152', 30) may be vertically coincident, i.e., may be located within same vertical planes. The photoresist layer 59 may be subsequently removed, for example, by ashing.

FIG. 15A is a top-down view of the second exemplary structure after formation of a gate electrode, a ferroelectric dielectric layer, a metal-rich metal oxide layer, and a dielectric metal nitride layer according to the second embodiment of the present disclosure. FIG. 15B is a vertical cross-sectional view of the second exemplary structure along the plane B-B' of FIG. 15A. Referring to FIGS. 15A and 15B, another photoresist layer 69 may be applied over the in-process gate electrode 58', and may be lithographically patterned to cover a center portion of the in-process gate electrode 58'. The patterned photoresist layer 69 may have a pair of parallel edges that laterally extend along the second horizontal direction hd2. An anisotropic etch process may be performed to remove unmasked portions of the in-process gate electrode 58', the in-process ferroelectric dielectric layer 54', the in-process metal-rich metal oxide layer 151', and the in-process dielectric metal nitride layer 152'. A remaining portion of the in-process gate electrode 58' that underlies a patterned portion of the photoresist layer 69 constitutes a gate electrode 58. A remaining portion of the in-process ferroelectric dielectric layer 54' that underlies the patterned portion of the photoresist layer 69 constitutes a ferroelectric dielectric layer 54. A remaining portion of the in-process metal-rich metal oxide layer 151' that underlies the patterned portion of the photoresist layer 69 constitutes a metal-rich metal oxide layer 151. A remaining portion of the in-process dielectric metal nitride layer 152' that underlies the patterned portion of the photoresist layer 69 constitutes a dielectric metal nitride layer 152. Sidewalls of the gate electrode 58, the ferroelectric dielectric layer 54, the metal-rich metal oxide layer 151, and the dielectric metal nitride layer 152 may be vertically coincident.

Figure 16A:
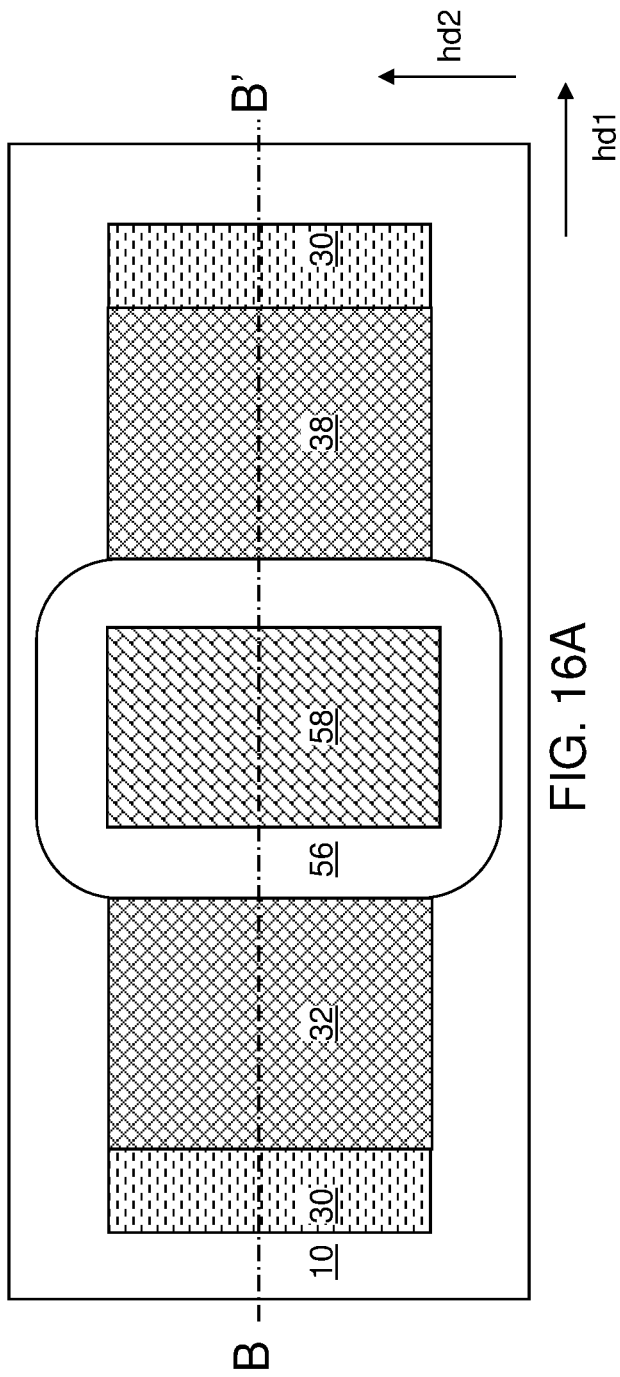
FIG. 16A is a top-down view of the second exemplary structure after formation of a dielectric gate spacer, a source region, and a drain region according to the second embodiment of the present disclosure.
Figure 16B:
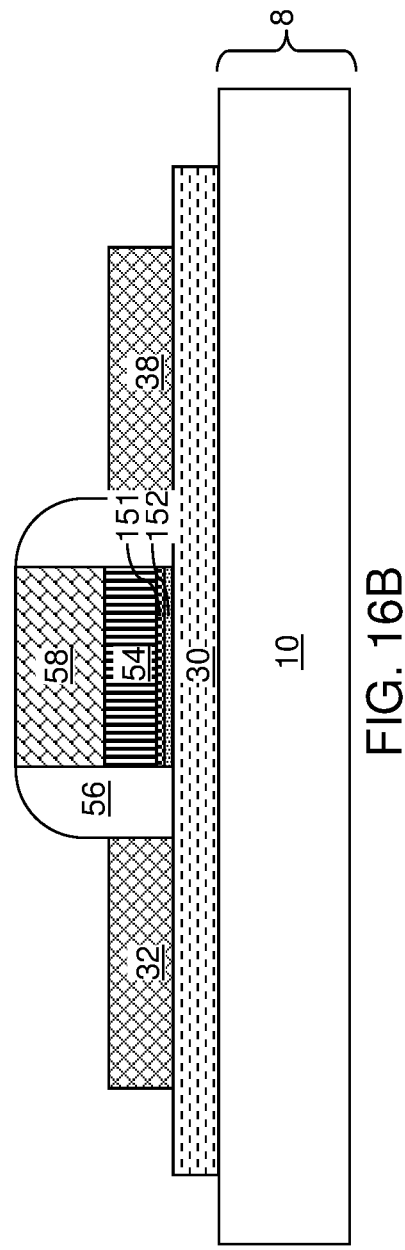
FIG. 16B is a vertical cross-sectional view of the second exemplary structure along the plane B-B' of FIG. 16A.

FIG. 16A is a top-down view of the second exemplary structure after formation of a dielectric gate spacer, a source region, and a drain region according to the second embodiment of the present disclosure. FIG. 16B is a vertical cross-sectional view of the second exemplary structure along the plane B-B' of FIG. 16A. Referring to FIGS. 16A and 16B, a dielectric gate spacer 56 may be optionally formed around the layer stack including the gate electrode 58, the ferroelectric dielectric layer 54, the metal-rich metal oxide layer 151, and the dielectric metal nitride layer 152. The dielectric gate spacer 56 may laterally surround the gate electrode 58, the ferroelectric dielectric layer 54, the metal-rich metal oxide layer 151, and the dielectric metal nitride layer 152. A source region 32 and a drain region 38 may be formed on the physically exposed top surfaces of the metal oxide semiconductor layer 30. The source region 32 may be formed directly on, and thus contacts, a first portion of the metal oxide semiconductor layer 30 that may be laterally offset from the gate electrode 58, and the drain region 38 may be formed directly on, and thus contacts, a second portion of the metal oxide semiconductor layer 30 that may be laterally offset from the gate electrode 58 and the source region 32. The source region 32 and the drain region 38 may have the same material composition and the same thickness as in the first exemplary structure.

FIG. 17A is a top-down view of the second exemplary structure after formation of a contact-level dielectric layer and contact via structures according to the second embodiment of the present disclosure. FIG. 17B is a vertical cross-sectional view of the second exemplary structure along the plane BB' of FIG. 17A. Referring to FIGS. 17A and 17B, the processing steps of FIGS. 8A-8C may be performed to form a contact-level dielectric layer 70 and contact via structures (82, 85, 88). The contact via structures (82, 88, 85) include a source contact via structure 82 contacting the source region 32, a drain contact via structure 88 contacting the drain region 38, and gate contact via structures 85 contacting the gate electrode 58.

Figure 18:
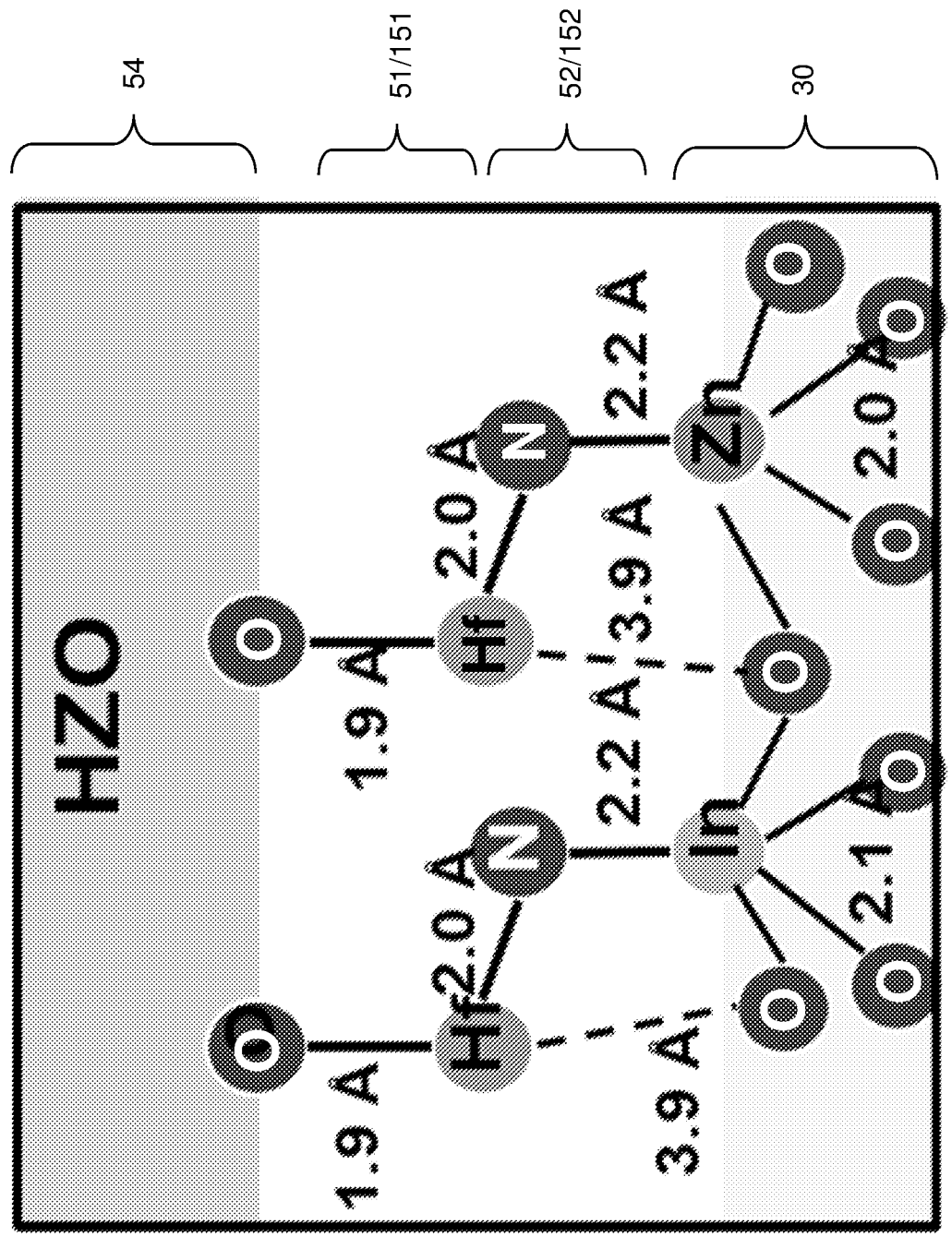
FIG. 18 is a schematic illustrating an exemplary atomic bonding configuration at an interface region between a ferroelectric dielectric layer and a metal oxide semiconductor layer according the various embodiments of the present disclosure.

FIG. 18 is a schematic illustrating an exemplary atomic bonding configuration at an interface region between a ferroelectric dielectric layer and a metal oxide semiconductor layer according the various embodiments of the present disclosure. Referring to FIG. 18, an exemplary atomic bonding configuration at an interface region between a ferroelectric dielectric layer 54 and a metal oxide semiconductor layer 30 is schematically illustrated for an embodiment in which the ferroelectric dielectric layer 54 includes hafnium zirconium oxide (HZO), the metal oxide semiconductor layer 30 includes indium gallium zinc oxide (IGZO), and the metal element in the metal-rich metal oxide layer (51, 151) includes an oxide of hafnium with average coordination number of hafnium less than 2. A full bond between a hafnium atom and an oxygen atom may have an interatomic bonding distance of about 1.9 angstroms. Due to the partial coordination of the hafnium atoms by the oxygen atoms or nitrogen atoms, weak interaction may be present between hafnium atoms and oxygen atoms with an interatomic distance (such as 3.9 angstroms) that exceeds the interatomic bonding distance of 1.9 angstroms. The metal-rich metal oxide layer (51, 151) eliminates oxygen deficiency in the interface region between the metal oxide semiconductor layer 30 and the ferroelectric dielectric layer 54.

Figure 19A:
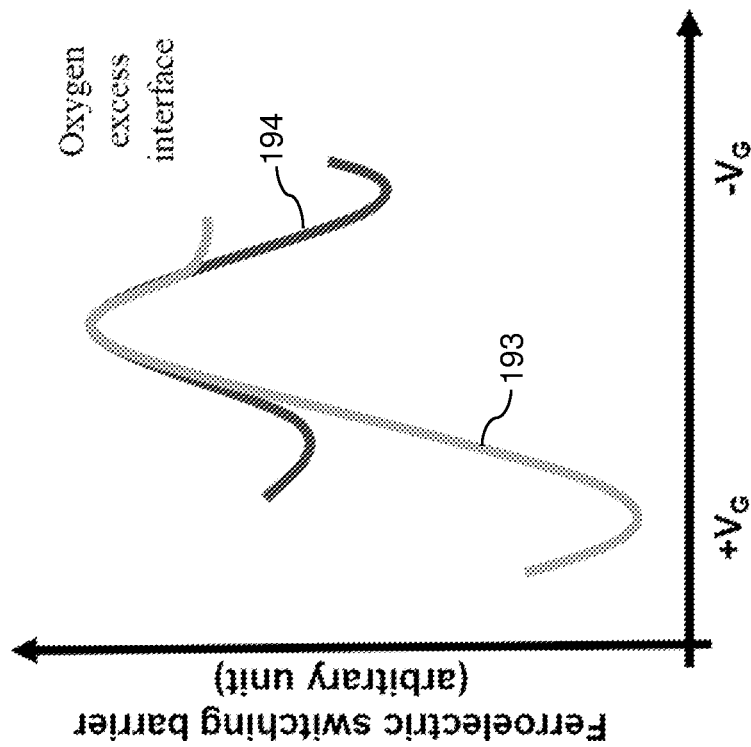
FIG. 19A is an energy diagram illustrating the shift in the energy level profile of a ferroelectric dielectric layer in embodiments in which a surface of a metal oxide semiconductor layer is oxygen-deficient with, and without, formation of a stack of a dielectric metal nitride layer and a metal-rich metal oxide layer according to an embodiment of the present disclosure.

FIG. 19A is an energy diagram illustrating the shift in the energy level profile of a ferroelectric dielectric layer 54 in embodiments in which a surface of a metal oxide semiconductor layer 30 is oxygen-deficient prior to formation of a stack of a dielectric metal nitride layer (52, 152) and a metal-rich metal oxide layer (51, 151). Curve 191 illustrates the embodiment in which the metal oxide semiconductor layer 30 directly contacts the ferroelectric dielectric layer 54, and curve 192 illustrates the embodiment in which a stack of a dielectric metal nitride layer (52, 152) and a metal-rich metal oxide layer (51, 151) is formed between the metal oxide semiconductor layer 30 and the ferroelectric dielectric layer 54 according to an embodiment of the present disclosure.

Figure 19B:
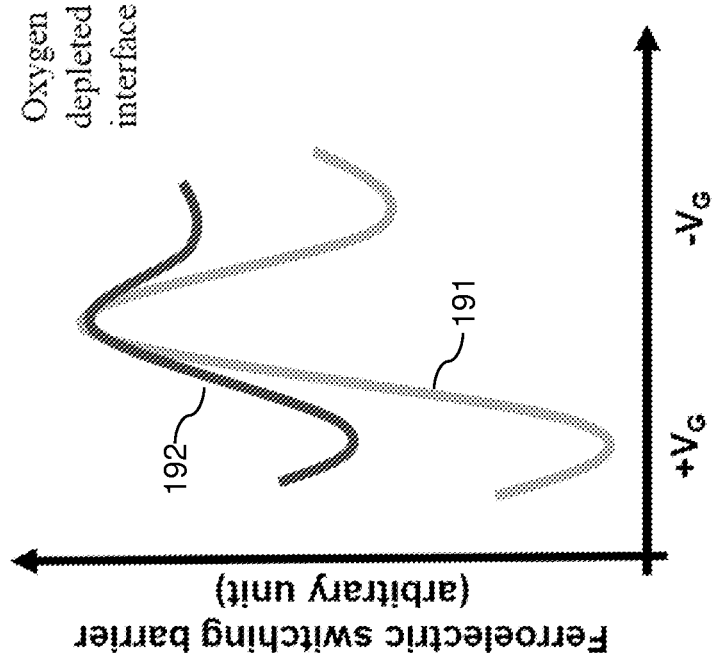
FIG. 19B is an energy diagram illustrating the shift in the energy level profile of a ferroelectric dielectric layer in embodiments in which a surface of a metal oxide semiconductor layer is oxygen-rich with, and without, formation of a stack of a dielectric metal nitride layer and a metal-rich metal oxide layer according to an embodiment of the present disclosure.

FIG. 19B is an energy diagram illustrating the shift in the energy level profile of a ferroelectric dielectric layer 54 in embodiments in which a surface of a metal oxide semiconductor layer 30 is oxygen-rich prior to formation of a stack of a dielectric metal nitride layer (52, 152) and a metal-rich metal oxide layer (51, 151). Curve 193 illustrates the embodiment in which the metal oxide semiconductor layer 30 directly contacts the ferroelectric dielectric layer 54, and curve 194 illustrates the embodiment in which a stack of a dielectric metal nitride layer (52, 152) and a metal-rich metal oxide layer (51, 151) is formed between the metal oxide semiconductor layer 30 and the ferroelectric dielectric layer 54 according to an embodiment of the present disclosure.

Comparison of curves 192 and 194 with curves 191 and 193 show that the asymmetry between the energy levels of the two ferroelectric states (formed by application of a positive gate voltage $+V_G$ or formed by application of a negative gate voltage $-V_G$) is reduced upon formation of the stack of the dielectric metal nitride layer (52, 152) and the metal-rich metal oxide layer (51, 151) both in the embodiment of an oxygen-deficient interface and in the embodiment of an oxygen-rich interface. Reduction of the asymmetry in the energy levels may enhance data retention characteristics of the ferroelectric memory device of embodiments of the present disclosure. Further, the energy barrier for programming the ferroelectric dielectric layer 54 between the two ferroelectric states is reduced upon formation of the stack of the dielectric metal nitride layer (52, 152) and the metal-rich metal oxide layer (51, 151). Reduction of the energy barrier for transition between the two ferroelectric states lowers the programming energy, and provides a low voltage operation of the ferroelectric memory device of embodiments of the present disclosure.

Generally, the stack of the dielectric metal nitride layer (52, 152) and the metal-rich metal oxide layer (51, 151) functions as an interfacial dual passivation layer. The interfacial dual passivation layer of the present disclosure reduces formation of surface metal-metal bonds, and thus, reduces device leakage between the metal oxide semiconductor layer 30 and the ferroelectric dielectric layer 54. The surface oxygen atoms of the metal oxide semiconductor layer 30 bond with the metal atoms in the metal-rich metal oxide layer (51, 151).

Figure 20:
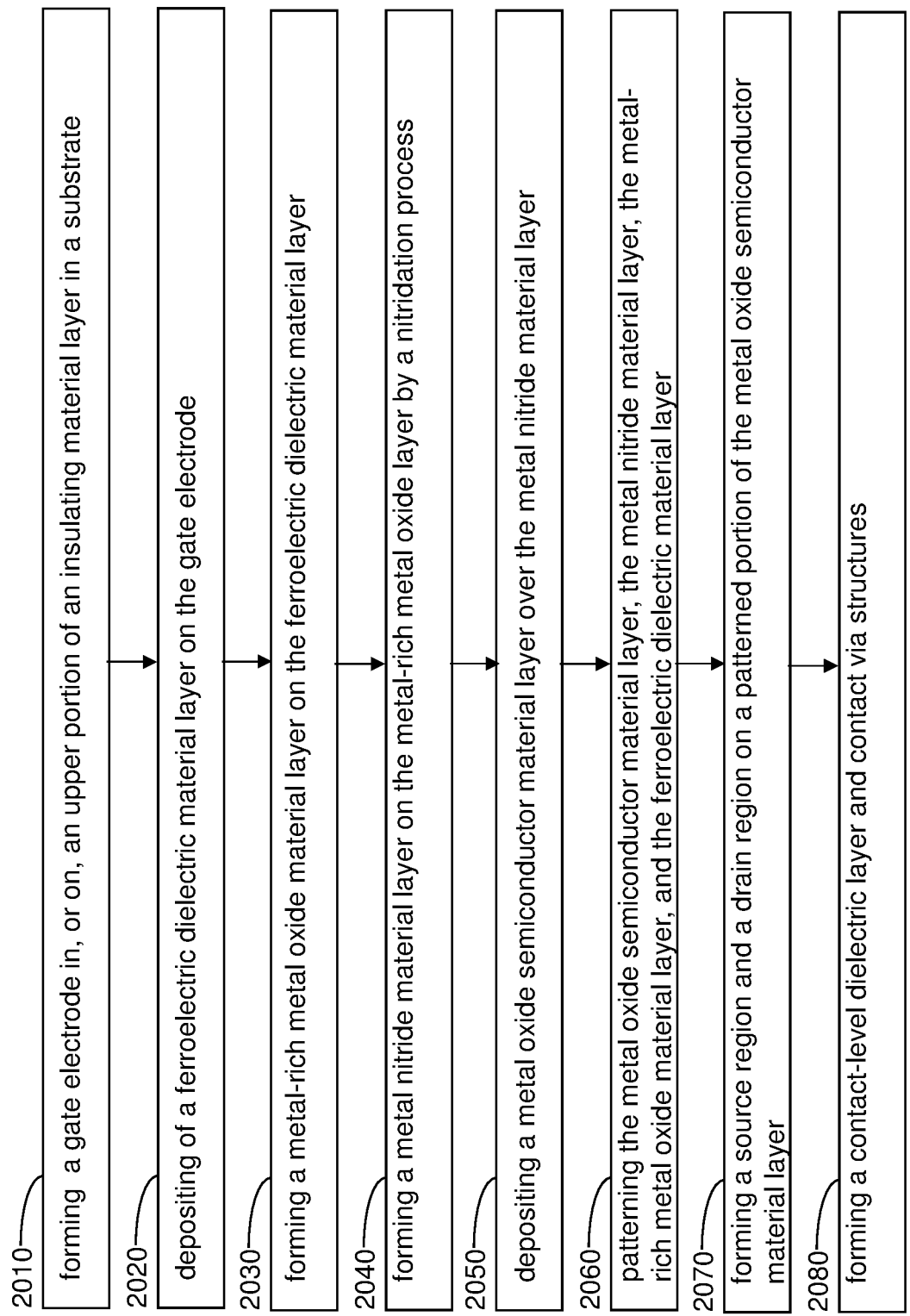
FIG. 20 is a first flow chart illustrating general processing steps for forming the first exemplary structure according to the first embodiment of the present disclosure.

Referring to FIG. 20, a first flow chart illustrates general processing steps for forming the first exemplary structure according to the first embodiment of the present disclosure. Referring to step 2010 and FIGS. 1A, 1B, 8A, 8B, 8C, 9A, and 9B, a gate electrode 58 may be formed in, or on, an upper portion of an insulating material layer 10 over a substrate 8. Referring to step 2020 and FIGS. 2, 8A, 8B, 8C, 9A, and 9B, a ferroelectric dielectric material layer 54L may be deposited on the gate electrode 58. Referring to step 2030 and FIGS. 3, 8A, 8B, 8C, 9A, and 9B, a metal-rich metal oxide material layer 51L may be deposited on the ferroelectric dielectric material layer 54L. Referring to step 2040 and FIGS. 4, 8A, 8B, 8C, 9A, and 9B, a dielectric metal nitride material layer 52L may be formed on the metal-rich metal oxide layer 51L. Referring to step 2050 and FIGS. 5, 8A, 8B, 8C, 9A, and 9B, a metal oxide semiconductor material layer 30L may be formed over the dielectric metal nitride material layer 52L. Referring to step 2060 and FIGS. 6A, 6B, 8A, 8B, 8C, 9A, and 9B, the metal oxide semiconductor material layer 30L, the dielectric metal nitride material layer 52L, the metal-rich metal oxide material layer 51L, and the ferroelectric dielectric material layer 54L may be patterned. Referring to step 2070 and FIGS. 7A-9B, a source region 32 and a drain region 38 may be formed on a patterned portion of the metal oxide semiconductor material layer 30L. Referring to step 2080 and FIGS. 7A-9B, contact via structures (72, 82, 75, 85, 78, 88) may be formed through a contact-level dielectric layer 70 to electrically contact the source region 32, gate electrode 58, and drain region 38, respectively.

Figure 21:
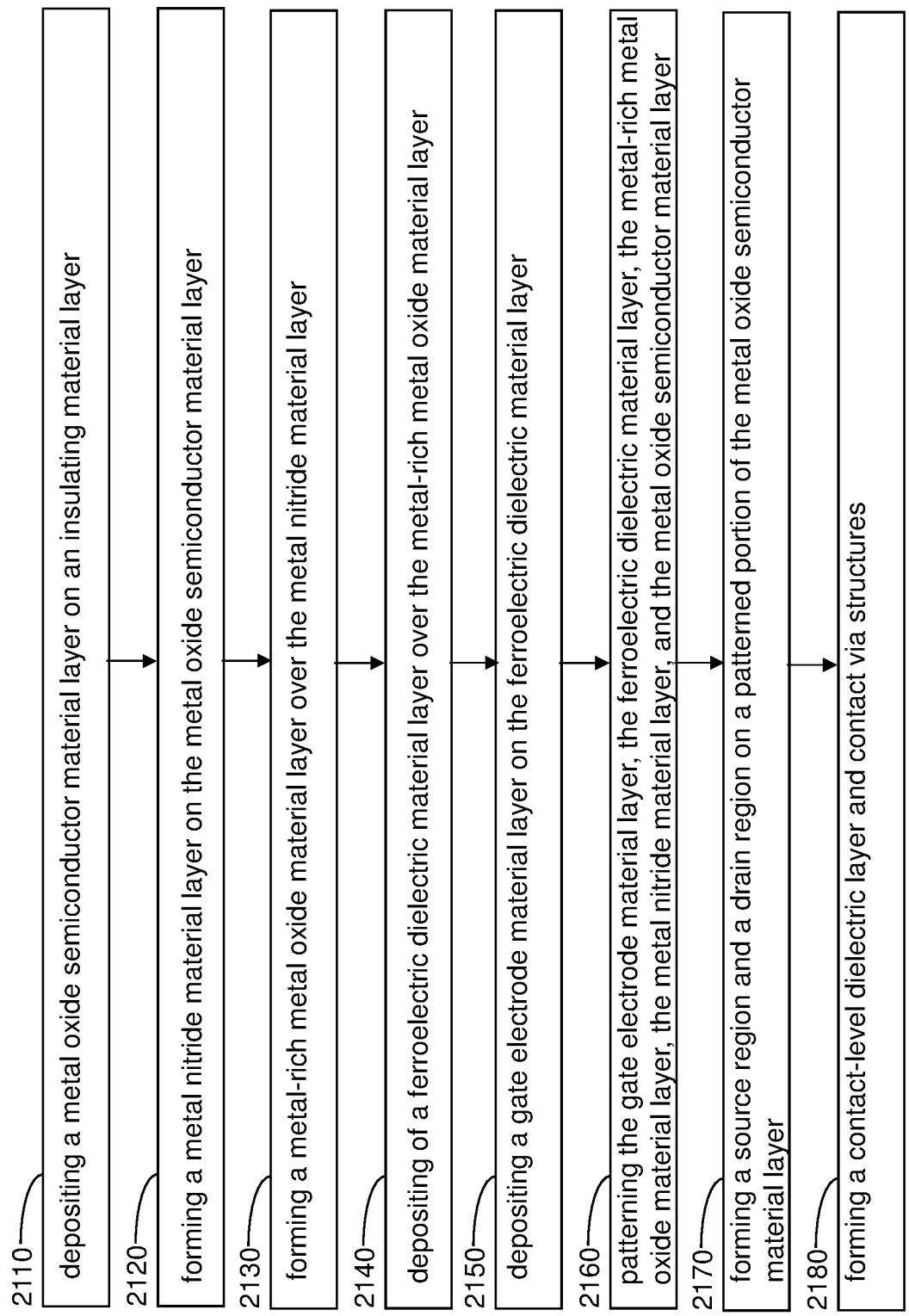
FIG. 21 is a second flow chart illustrating general processing steps for forming the second exemplary structure according to the second embodiment of the present disclosure.

Referring to FIG. 21, a second flow chart illustrates general processing steps for forming the second exemplary structure according to the second embodiment of the present disclosure. Referring to step 2110 and FIG. 10, a metal oxide semiconductor material layer 30L may be deposited on an insulating material layer 10 over a substrate 8. Referring to step 2120 and FIG. 11, a dielectric metal nitride material layer 152L may be formed on the metal oxide semiconductor material layer 30L. Referring to step 2130 and FIGS. 12 and 13, a metal-rich metal oxide material layer 151L may be formed over the dielectric metal nitride material layer 152L. Referring to step 2140 and FIG. 13, a ferroelectric dielectric material layer 54L may be formed over the metal-rich metal oxide material layer 151L. Referring to step 2150 and FIG. 13, a gate electrode material layer 58L may be formed on the ferroelectric dielectric material layer 54L. Referring to step 2160 and FIGS. 14A, 14B, 15A, and 15B, the gate electrode material layer 58L, the ferroelectric dielectric material layer 54L, the metal-rich metal oxide material layer 151L, the dielectric metal nitride material layer 152L, and the metal oxide semiconductor material layer 30L may be patterned. Referring to step 2170 and FIGS. 16A, 16B, 17A, and 17B, a source region 32 and a drain region 38 may be formed on a patterned portion of the metal oxide semiconductor material layer 30L. Referring to step 2180 and FIGS. 10-17B, contact via structures (82, 85, 88) may be formed through a contact-level dielectric layer 70 to electrically contact the source region 32, gate electrode 58, and drain region 38, respectively.

Referring to all drawings and according to various embodiments of the present disclosure, a semiconductor structure is provided. The semiconductor structure comprises an insulating material layer 10 located over a substrate 8; and a ferroelectric field effect transistor located over the insulating material layer 10. The ferroelectric field effect transistor comprises, from bottom to top or from top to bottom: a gate electrode 58; a gate dielectric comprising a stack of a ferroelectric dielectric layer 54, a metal-rich metal oxide layer (51, 151), and a dielectric metal nitride layer (52, 152); and a metal oxide semiconductor layer 30 comprising a semiconductor channel of the field effect transistor.

In one embodiment, the metal oxide semiconductor layer 30 overlies the gate electrode 58 as in the first exemplary structure. In another embodiment, the gate electrode 58 overlies the metal oxide semiconductor layer 30. In one embodiment, a source region 32 contacts a first portion of the metal oxide semiconductor layer 30 that is laterally offset from the gate electrode 58; and a drain region 38 contacts a second portion of the metal oxide semiconductor layer 30 that is laterally offset from the gate electrode 58 and the source region 32.

In one embodiment, the metal-rich metal oxide layer (51, 151) includes a non-stoichiometric and metal-rich oxide of a metallic element. In one embodiment, the dielectric metal nitride layer (52, 152) includes a dielectric metal nitride of the metallic element. In one embodiment, the metallic element is selected from Hf, Al, Ti, Zr, and Ga. In one embodiment, the ferroelectric dielectric layer 54 comprises a dielectric metal oxide of a transition metal that is different from the metallic element. In one embodiment, the metallic element is different from any metallic element that is present within the metal oxide semiconductor layer 30.

In one embodiment, the dielectric metal nitride layer 52 may be a continuous monolayer of a dielectric metal nitride. In one embodiment, the dielectric metal nitride layer 52 may be stoichiometric, and may comprise metal atoms and nitrogen atoms at a 1:1 atomic ratio. In one embodiment, the metal atoms may be selected from Hf, Al, Ti, Zr, and Ga. In one embodiment, the dielectric metal nitride layer 52 may include a continuous monolayer of stoichiometric HfN. The thickness of the metal-rich metal oxide material layer 51 may be in a range from 0.1 nm to 0.5 nm, such as from 0.2 nm to 0.4, although lesser and greater thicknesses may also be used. The thickness of the dielectric metal nitride layer 52 may be in a range from 0.2 nm to 0.4 nm.

In one embodiment, the dielectric metal nitride layer 152 may be a continuous monolayer of a dielectric metal nitride. In one embodiment, the dielectric metal nitride layer 152 may be stoichiometric, and may comprise metal atoms and nitrogen atoms at a 1:1 atomic ratio. In one embodiment, the metal atoms may be selected from Hf, Al, Ti, Zr, and Ga. In one embodiment, the dielectric metal nitride layer 152 may include a continuous monolayer of stoichiometric HfN. The thickness of the dielectric metal nitride layer 152 may be in a range from 0.2 nm to 0.4 nm.

In one embodiment, the gate electrode 58 contacts a first portion of the insulating material layer 10; and the ferroelectric dielectric layer 54 contacts a second portion of the insulating material layer 10.

In one embodiment, a planar bottom surface of the metal oxide semiconductor layer 30 contacts a top surface of the insulating material layer 10. In one embodiment, a dielectric gate spacer 56 may laterally surround the gate electrode 58, the ferroelectric dielectric layer 54, the metal-rich metal oxide layer 151, and the dielectric metal nitride layer 152.

The various embodiments of the present disclosure may be used to provide a ferroelectric memory device comprising a field effect transistor that includes a combination of a ferroelectric dielectric layer 54, the metal-rich metal oxide layer (51, 151), and the dielectric metal nitride layer (52, 152) as a gate dielectric. The combination of the metal-rich metal oxide layer (51, 151) and the dielectric metal nitride layer (52, 152) may function as an interfacial dual passivation layer that increases the stability of the programmed ferroelectric states of the ferroelectric dielectric layer 54 and reduces the energy barrier for programming the ferroelectric states of the ferroelectric dielectric layer 54. Thus, the endurance of the ferroelectric memory device may be enhanced, and the operational voltage of the ferroelectric memory device may be reduced according to the various embodiments of the present disclosure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:
1. A semiconductor structure comprising:
an insulating material layer;

a ferroelectric field effect transistor located over the insulating material layer, wherein the ferroelectric field effect transistor comprises:
a gate electrode;
a gate dielectric comprising a stack of a ferroelectric dielectric layer, a metal-rich hafnium oxide layer consisting essentially of a non-stoichiometric hafnium oxide element and having a thickness that is not greater than a distance of a full bond between a fully bonded pair of a hafnium atom and an oxygen atom, and a stoichiometric HfN layer having a thickness in a range from 0.2 nm to 0.4 nm; and
a metal oxide semiconductor layer comprising a semiconductor channel, wherein a subset of hafnium atoms within a combination of the stoichiometric HfN layer and the metal-rich hafnium oxide layer has first interatomic bonding at a first Hf-O interatomic bonding distance that provides said full bond with a respective surface oxygen atom selected from surface oxygen atoms of the ferroelectric dielectric layer due to proximity of the subset of hafnium atoms to the ferroelectric dielectric layer, and has second interatomic bondings at a second Hf-O interatomic bonding distance that is greater than the first Hf-O interatomic bonding distance and provides a weaker bonding than said full bond with a respective surface oxygen atom selected from the surface oxygen atoms of the metal oxide semiconductor layer due to proximity of the subset of hafnium atoms to the surface oxygen atoms of the metal oxide semiconductor layer by virtue of the stoichiometric HfN layer having the thickness in the range from 0.2 nm to 0.4 nm, whereby oxygen deficiency is eliminated and an oxygen excess interface region is provided within the combination of the stoichiometric HfN layer and the metal-rich hafnium oxide layer between the metal oxide semiconductor layer and the ferroelectric dielectric layer due to presence of the first interatomic bondings and the second interatomic bondings.

2. The semiconductor structure of claim 1, wherein the metal oxide semiconductor layer overlies the gate electrode.

3. The semiconductor structure of claim 1, wherein the gate electrode overlies the metal oxide semiconductor layer.

4. The semiconductor structure of claim 1, further comprising:
a source region contacting a first portion of the metal oxide semiconductor layer that is laterally offset from the gate electrode; and
a drain region contacting a second portion of the metal oxide semiconductor layer that is laterally offset from the gate electrode and the source region.

5. The semiconductor structure of claim 1, wherein the metal oxide semiconductor layer is free of hafnium.

6. The semiconductor structure of claim 1, the stoichiometric HfN layer is a continuous monolayer of HfN.

7. The semiconductor structure of claim 1, wherein:
the gate electrode contacts a first portion of the insulating material layer; and
the ferroelectric dielectric layer contacts a second portion of the insulating material layer.

8. The semiconductor structure of claim 1, wherein the metal-rich metal oxide layer has a thickness not greater than 0.19 nm.

9. The semiconductor structure of claim 1, wherein:
the ferroelectric dielectric layer comprises hafnium zirconium oxide; and
the metal oxide semiconductor layer comprises indium gallium zinc oxide.

10. A semiconductor structure comprising:
an insulating material layer having;
a ferroelectric field effect transistor located over the insulating material layer, wherein the ferroelectric field effect transistor comprises:
a gate electrode in contact with the insulating material layer;
a gate dielectric comprising a stack of a ferroelectric dielectric layer, a metal-rich hafnium oxide layer consisting essentially of a non-stoichiometric hafnium oxide and having a thickness that is not greater than a distance of a full bond between a fully bonded pair of a hafnium atom and an oxygen atom, and a stoichiometric HfN layer having a thickness in a range from 0.2 nm to 0.4 nm; and
a metal oxide semiconductor layer comprising a semiconductor channel and spaced from the gate electrode by the gate dielectric,
wherein a subset of hafnium atoms within a combination of the stoichiometric HfN layer and the metal-rich hafnium oxide layer has first interatomic bonding at a first Hf-O interatomic bonding distance that provides said full bond with a respective surface oxygen atom selected from surface oxygen atoms of the ferroelectric dielectric layer due to proximity of the subset of hafnium atoms to the ferroelectric dielectric layer, and additionally has second interatomic bondings at a second Hf-O interatomic bonding distance that is greater than the first Hf-O interatomic bonding distance and provides a weaker bonding than said full bond with a respective surface oxygen atom selected from the surface oxygen atoms of the metal oxide semiconductor layer due to proximity of the subset of hafnium atoms to the surface oxygen atoms of the metal oxide semiconductor layer by virtue of the stoichiometric HfN layer having the thickness in the range from 0.2 nm to 0.4 nm, whereby oxygen deficiency is eliminated and an oxygen excess interface region is provided within the combination of the stoichiometric HfN layer and the metal-rich hafnium oxide layer between the metal oxide semiconductor layer and the ferroelectric dielectric layer due to presence of the first interatomic bondings and the second interatomic bondings.

11. The semiconductor structure of claim 10, wherein the ferroelectric dielectric layer is in direct contact with the insulating material layer.

12. The semiconductor structure of claim 10, wherein a top surface of the gate electrode is located within a horizontal plane including a top surface of the insulating material layer.

13. The semiconductor structure of claim 10, wherein an average atomic coordination number of the non-stoichiometric hafnium oxide is in a range from 0.5 to 1.8.

14. The semiconductor structure of claim 10, further comprising:
a source region contacting a first portion of the metal oxide semiconductor layer that is laterally offset from the gate electrode; and
a drain region contacting a second portion of the metal oxide semiconductor layer that is laterally offset from the gate electrode and the source region.

15. The semiconductor structure of claim 10, wherein:
the gate electrode contacts a first portion of the insulating material layer; and the ferroelectric dielectric layer contacts a second portion of the insulating material layer.

16. A ferroelectric field effect transistor comprising:
a gate electrode;
a gate dielectric comprising a stack of a ferroelectric dielectric layer, a metal-rich hafnium oxide layer consisting essentially of a non-stoichiometric hafnium oxide and having a thickness that is not greater than a distance of a full bond between a fully bonded pair of a hafnium atom and an oxygen atom, and a stoichiometric HfN layer having a thickness in a range from 0.2 nm to 0.4 nm; and
a metal oxide semiconductor layer comprising a semiconductor channel and spaced from the gate electrode by the gate dielectric,
wherein a subset of hafnium atoms within a combination of the stoichiometric HfN layer and the metal-rich hafnium oxide layer has first interatomic bonding at a first Hf-O interatomic bonding distance that provides said full bond with a respective surface oxygen atom selected from surface oxygen atoms of the ferroelectric dielectric layer due to proximity of the subset of hafnium atoms to the ferroelectric dielectric layer, and additionally has second interatomic bondings at a second Hf-O interatomic bonding distance that is greater than the first Hf-O interatomic bonding distance and provides a weaker bonding than said full bond with a respective surface oxygen atom selected from the surface oxygen atoms of the metal oxide semiconductor layer due to proximity of the subset of hafnium atoms to the surface oxygen atoms of the metal oxide semiconductor layer by virtue of the stoichiometric HfN layer having the thickness in the range from 0.2 nm to 0.4 nm, whereby oxygen deficiency is eliminated and an oxygen excess interface region is provided within the combination of the stoichiometric HfN layer and the metal-rich hafnium oxide layer between the metal oxide semiconductor layer and the ferroelectric dielectric layer due to presence of the first interatomic bondings and the second interatomic bondings.

17. The ferroelectric field effect transistor of claim 16, wherein sidewalls of the metal oxide semiconductor layer are vertically coincident with sidewalls of the gate dielectric.

18. The ferroelectric field effect transistor of claim 16, wherein
an average atomic coordination number of the non-stoichiometric hafnium oxide is in a range from 0.5 to 1.8.

19. The ferroelectric field effect transistor of claim 16, wherein:
the ferroelectric dielectric layer comprises hafnium zirconium oxide; and
the metal oxide semiconductor layer comprises indium gallium zinc oxide.

20. The semiconductor structure of claim 16, further comprising:
a source region contacting a first portion of the metal oxide semiconductor layer that is laterally offset from the gate electrode; and
a drain region contacting a second portion of the metal oxide semiconductor layer that is laterally offset from the gate electrode and the source region.

* * * * *